US011774493B2

United States Patent
Iwao et al.

(10) Patent No.: US 11,774,493 B2
(45) Date of Patent: Oct. 3, 2023

(54) SEMICONDUCTOR INTEGRATED CIRCUIT, METHOD OF TESTING THE SEMICONDUCTOR INTEGRATED CIRCUIT, AND SEMICONDUCTOR SUBSTRATE

(71) Applicant: CANON KABUSHIKI KAISHA, Tokyo (JP)

(72) Inventors: Koichi Iwao, Tokyo (JP); Eiki Aoyama, Chiba (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/707,671

(22) Filed: Mar. 29, 2022

(65) Prior Publication Data

US 2022/0317180 A1 Oct. 6, 2022

(30) Foreign Application Priority Data

Mar. 31, 2021 (JP) ................................. 2021-059051

(51) Int. Cl.
*G01R 31/28* (2006.01)

(52) U.S. Cl.
CPC ..... *G01R 31/2884* (2013.01); *G01R 31/2882* (2013.01); *G01R 31/2896* (2013.01)

(58) Field of Classification Search
CPC ............ G01R 31/2884; G01R 31/2882; G01R 31/2896; G01R 31/31713; G01R 31/3172; G01R 31/318572
USPC ....................................... 324/143, 76.11, 500
See application file for complete search history.

(56) References Cited

U.S. PATENT DOCUMENTS

| | | | |
|---|---|---|---|
| 2016/0091560 A1* | 3/2016 | Chien | H03K 5/26 324/750.3 |
| 2016/0291087 A1* | 10/2016 | Cheng | G01R 31/2896 |
| 2021/0088584 A1* | 3/2021 | Whetsei | G01R 31/318575 |

FOREIGN PATENT DOCUMENTS

JP H1048295 A 2/1998

* cited by examiner

*Primary Examiner* — Giovanni Astacio-Oquendo
(74) *Attorney, Agent, or Firm* — CANON U.S.A., INC. IP Division

(57) ABSTRACT

A semiconductor integrated circuit inputs and outputs signals regarding a test using two terminals, having a bidirectional terminal for input and output of data and an input terminal for input of a clock signal. A signal is output via the bidirectional terminal in accordance with an output control signal output from an output control circuit. The output control circuit performs control in synchronization with the clock signal to prevent data input to the bidirectional terminal and an output permission signal based on the output control signal from overlapping each other.

18 Claims, 20 Drawing Sheets

SEMICONDUCTOR INTEGRATED CIRCUIT, METHOD OF TESTING THE SEMICONDUCTOR INTEGRATED CIRCUIT, AND SEMICONDUCTOR SUBSTRATE

BACKGROUND

Field of the Disclosure

The present disclosure relates to a semiconductor integrated circuit, a method of testing the semiconductor integrated circuit, and a semiconductor substrate.

Description of the Related Art

When a test for a semiconductor integrated circuit is conducted using a small number of signals, a bidirectional pin is used in the large-scale integrated circuit (LSI) inspection system disclosed in Japanese Patent Laid-Open No. 10-48295 for purpose of using the same terminal for the input and output of data.

In the LSI inspection system disclosed in Japanese Patent Laid-Open No. 10-48295 in which a bidirectional pin is used, LSI inspection is performed using test signals. In an LSI inspection system in which a bidirectional pin is used, there is a case where input data and output data interfere with each other when two terminals available for the input and output of signals regarding a test are used. In this case, data cannot be input to a circuit under test.

An inspection system using the logic built-in self test (BIST) is generally considered. However, the incorporation of a BIST circuit leads to the increase in the size and area of a circuit in the case of a small-scale circuit configuration.

SUMMARY

The present disclosure provides an LSI inspection system in which a bidirectional pin is used and with which the interference between input data and output data is less likely to occur without the increase in the number of input terminals or the increase in circuit area.

A semiconductor integrated circuit according to an aspect of the present disclosure is configured to input and output signals regarding a test using two terminals. The semiconductor integrated circuit includes a bidirectional terminal for input and output of data and an input terminal for input of a clock signal and an output control circuit. A signal is output via the bidirectional terminal in accordance with an output control signal output from the output control circuit. The output control circuit is configured to perform control in synchronization with the clock signal to prevent data input to the bidirectional terminal and an output permission signal based on the output control signal from overlapping each other.

A semiconductor integrated circuit according to another aspect of the present disclosure is configured to input and output signals regarding a test using two terminals. The semiconductor integrated circuit includes a bidirectional terminal for input and output of data and an input terminal for input of a clock signal, an input buffer and an output buffer to which the bidirectional terminal is connected, an output control circuit configured to output an output control signal for controlling the output buffer, and a clock control circuit configured to gate the clock signal to generate an internal clock for controlling the output control circuit.

A semiconductor substrate according to still another aspect of the present disclosure is stacked on another semiconductor substrate. The semiconductor substrate includes two terminals, including a bidirectional terminal for input and output of data and an input terminal for input of a clock signal used as terminals via which signals regarding a test are input and output and an output control circuit. A signal is output via the bidirectional terminal in accordance with an output control signal output from the output control circuit. The output control circuit is configured to perform control in synchronization with the clock signal to prevent data input to the bidirectional terminal and an output permission signal based on the output control signal from overlapping each other.

A test method according to still another aspect of the present disclosure is a method of testing a semiconductor integrated circuit. The test method includes inputting and outputting signals regarding a test using two terminals, including a bidirectional terminal for input and output of data and an input terminal for input of a clock signal and changing the bidirectional terminal from an input terminal to an output terminal in a period between input of the data and next input of the data.

Further features of the present disclosure will become apparent from the following description of exemplary embodiments with reference to the attached drawings.

DESCRIPTION OF THE EMBODIMENTS

First Embodiment

Connection and Function of Each Element

The first embodiment will be described with reference to FIGS. 1 to 9.

Figure 1:
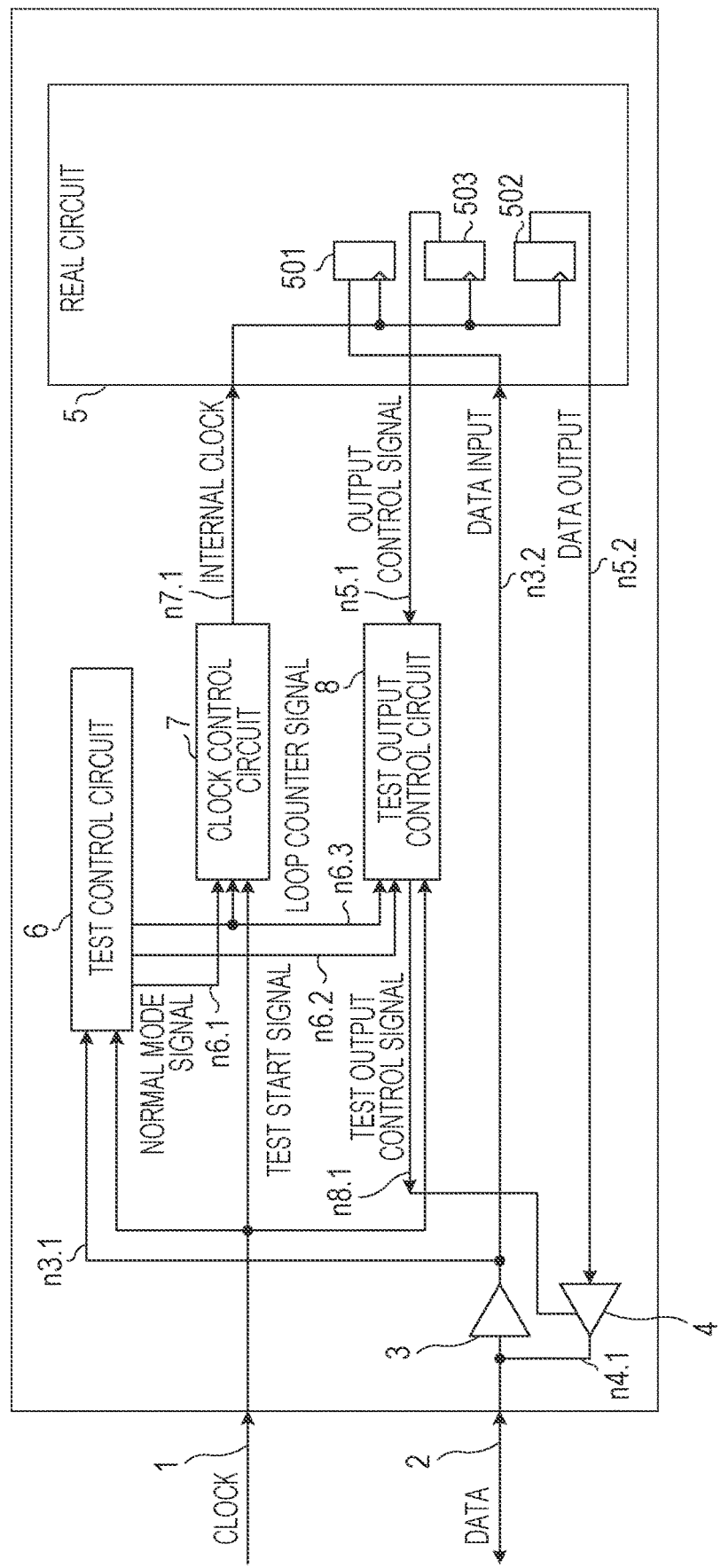
FIG. 1 is a schematic diagram of a semiconductor integrated circuit according to a first embodiment.

FIG. 1 is a schematic diagram of a semiconductor integrated circuit including a real circuit 5, a test control circuit 6, a clock control circuit 7, and a test output control circuit 8. This circuit has a clock input terminal 1 and a data input/output bidirectional terminal 2 and includes an input buffer 3 and an output buffer 4. The real circuit 5 includes an input flip-flop (hereinafter also referred to as "FF") 501, an output FF 502, and an output control FF 503.

The clock input terminal 1 is connected to the respective input terminals of the test control circuit 6, the clock control circuit 7, and the test output control circuit 8. A clock (1) input from the clock input terminal 1 synchronizes the test control circuit 6, the clock control circuit 7, and the test output control circuit 8.

The data input/output terminal 2 that is a bidirectional terminal is connected to the input terminal of the input buffer 3 and the output terminal of the output buffer 4. Data (2) input from the data input/output terminal 2 is input to the test control circuit 6 and the real circuit 5 via the input buffer 3.

The real circuit 5 is a portion that implements the product function of this semiconductor integrated circuit. For example, when a semiconductor integrated circuit that is a test target is a photoelectric conversion apparatus, a timing generator corresponds to the real circuit 5. The real circuit 5 outputs an output control signal (n5.1) and a data output (n5.2) on the basis of a data input (n3.2) input via the input buffer 3 and an internal clock (n7.1) output from the clock control circuit 7.

The test control circuit 6 outputs a normal mode signal (n6.1), a test start signal (n6.2), and a loop counter signal (n6.3) on the basis of the clock (1) and the data input (n3.2) which have been input thereto. The normal mode signal (n6.1) is input to the clock control circuit 7 to drive the clock control circuit 7. The test start signal (n6.2) is input to the test output control circuit 8 to drive the test output control circuit 8. The loop counter signal (n6.3) is input to both the clock control circuit 7 and the test output control circuit 8.

The clock control circuit 7 outputs the internal clock (n7.1). The output internal clock (n7.1) is input to the real circuit 5.

The test output control circuit 8 receives the output control signal (n5.1) from the real circuit 5 and outputs a test output control signal (n8.1). The output buffer 4 is controlled in accordance with the test output control signal (n8.1).

In this embodiment, by shifting the timings of the internal clock (n7.1) output from the clock control circuit 7 and the test output control signal (n8.1) output from the test output control circuit 8, the collision between input data and output data can be prevented.

Figure 2:
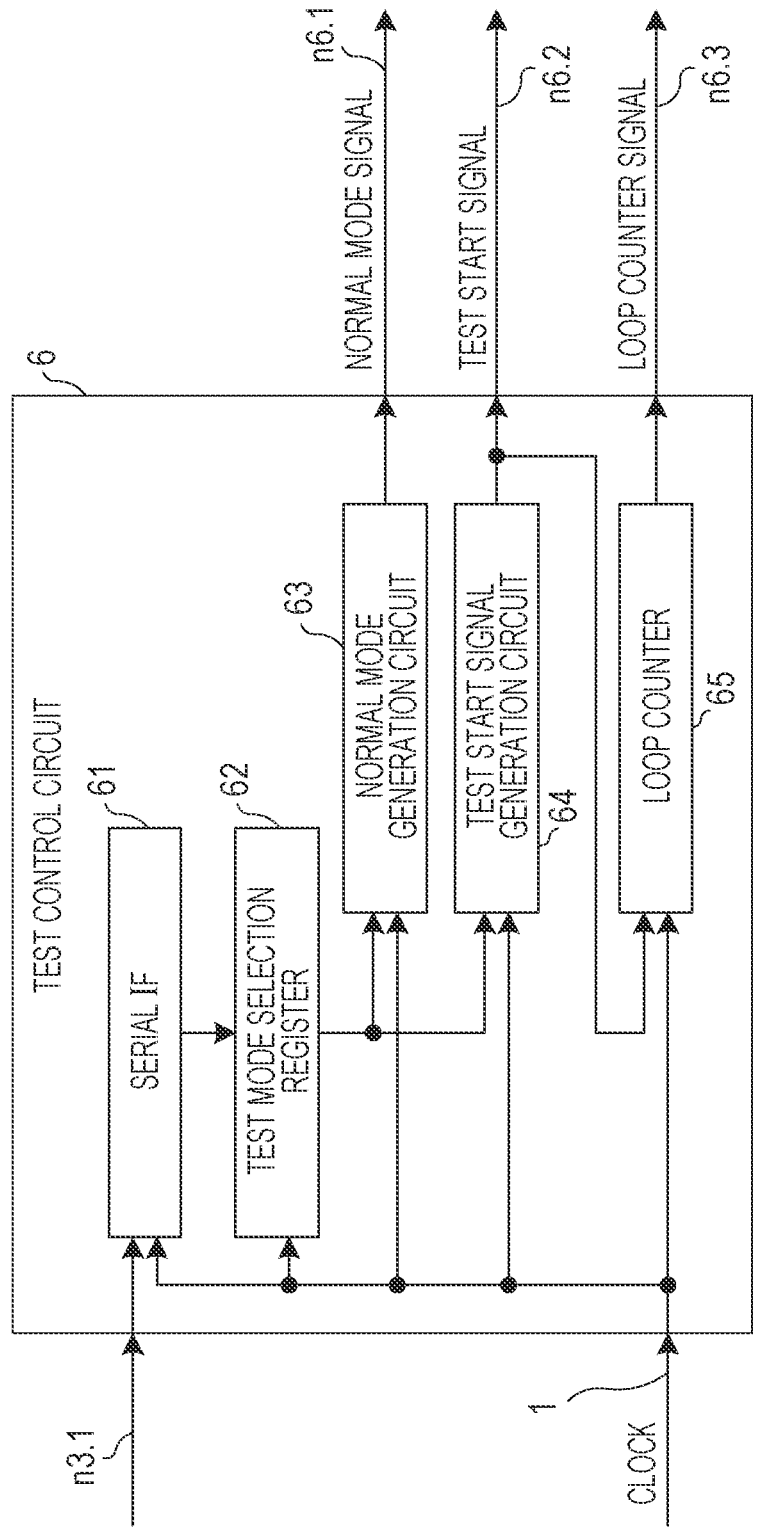
FIG. 2 is a schematic diagram of a test control circuit according to the first embodiment.

FIG. 2 is a schematic diagram of the test control circuit 6.

The test control circuit 6 includes a serial interface (hereinafter also referred to as "IF") 61, a test mode selection register 62, a normal mode generation circuit 63, a test start signal generation circuit 64, and a loop counter 65.

An output (n3.1) of the input buffer 3 and the clock (1) are input to the serial IF 61.

The output signal of the serial IF 61 and the clock (1) are input to the test mode selection register 62.

The output of the test mode selection register 62 and the clock (1) are input to the normal mode generation circuit 63 and the test start signal generation circuit 64. The normal mode generation circuit 63 outputs the normal mode signal (n6.1). The test start signal generation circuit 64 outputs the test start signal (n6.2). The test start signal (n6.2) and the clock (1) are input to the loop counter 65. The loop counter 65 outputs the loop counter signal (n6.3).

The serial IF 61 writes an output value into the test mode selection register 62 by communication. On the basis of the written value, the transition of the normal mode signal (n6.1) is made. Subsequently, the transition of the test start signal (n6.2) is made.

Figure 3:
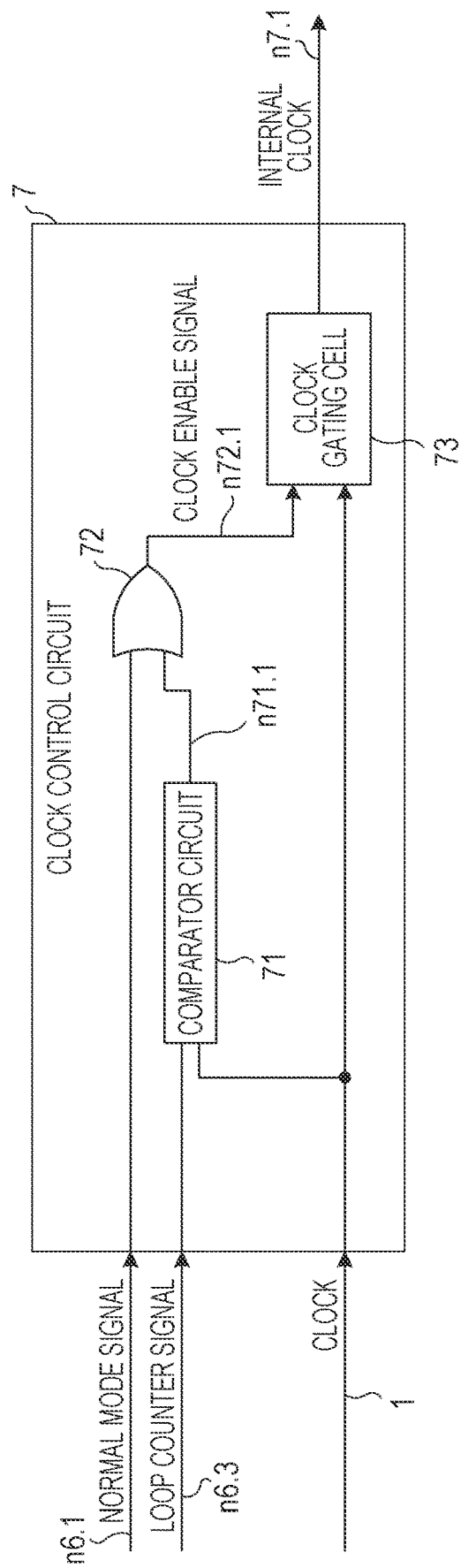
FIG. 3 is a schematic diagram of a clock control circuit according to the first embodiment.

FIG. 3 is a schematic diagram of the clock control circuit 7.

The clock control circuit 7 includes a comparator circuit 71, an OR circuit 72, and a clock gating cell 73.

As described above, the clock control circuit 7 receives the normal mode signal (n6.1), the loop counter signal (n6.3), and the clock (1) and outputs the internal clock (n7.1).

The transition of an output (n71.1) of the comparator circuit 71 is periodically made in accordance with the input loop counter signal (n6.3). The signal (n71.1) output from the comparator circuit 71 and the normal mode signal (n6.1) are input to the OR circuit 72. The OR circuit 72 generates and outputs a clock enable signal (n72.1).

The generated clock enable signal (n72.1) and the clock (1) are input to the clock gating cell 73. By gating the clock (1), the internal clock (n7.1) is output.

Figure 4:
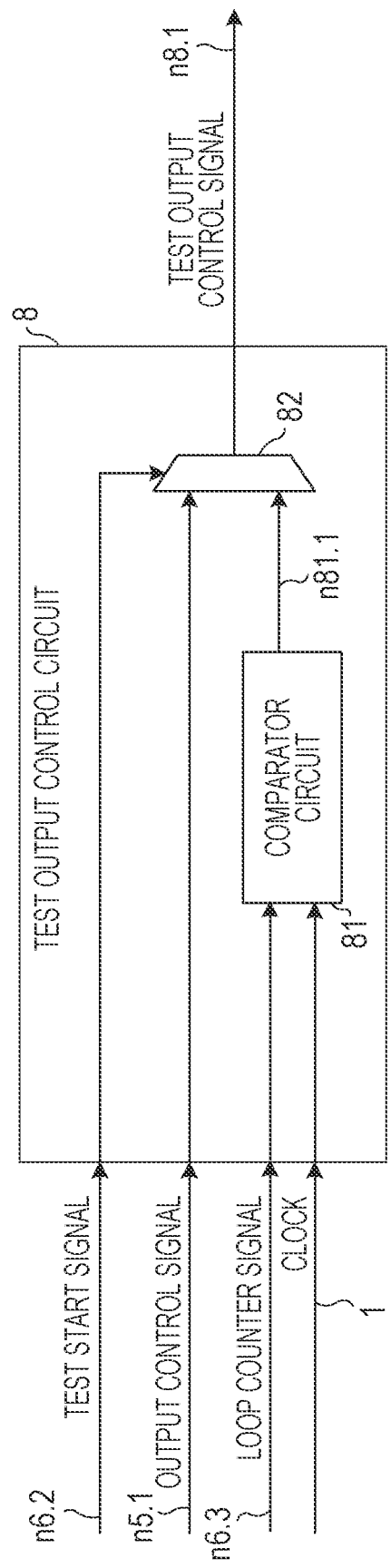
FIG. 4 is a schematic diagram of a test output control circuit according to the first embodiment.

FIG. 4 is a schematic diagram of the test output control circuit 8.

The test output control circuit 8 includes a comparator circuit 81 and a multiplexer 82.

As described above, the test output control circuit 8 receives the test start signal (n6.2), the output control signal (n5.1), the loop counter signal (n6.3), and the clock (1) and outputs the test output control signal (n8.1).

The transition of an output (n81.1) of the comparator circuit 81 is periodically made in accordance with the input loop counter signal (n6.3). The output (n81.1) of the comparator circuit 81 and the output control signal (n5.1) which are input to the multiplexer 82 are selected by the test start signal (n6.2) that is also input to the multiplexer 82 and output from the test output control circuit 8 as the test output control signal (n8.1).

Comparative Example

Figure 5:
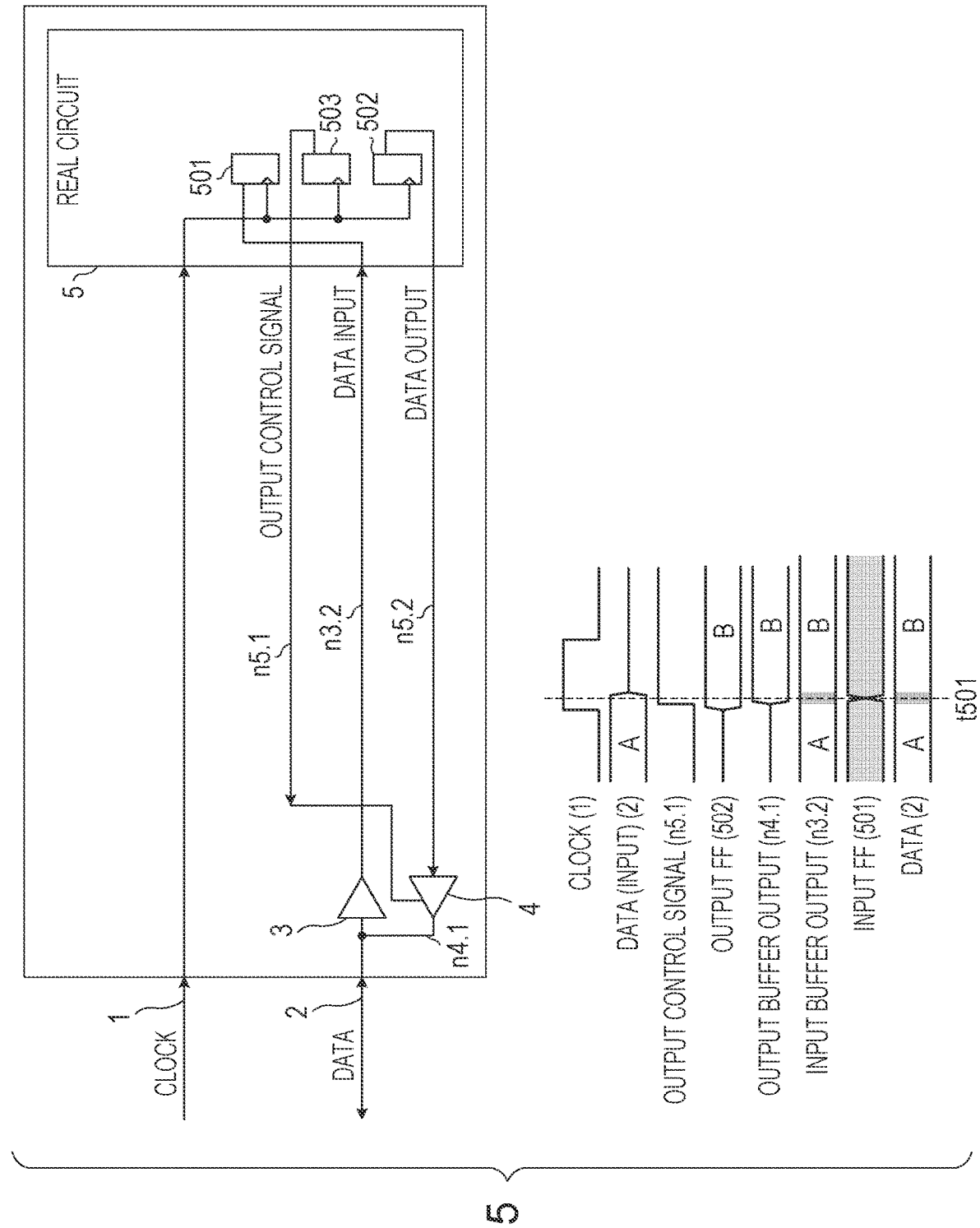
FIG. 5 is a schematic diagram and a timing chart of a comparative example of a semiconductor integrated circuit according to the first embodiment.

FIG. 5 is a schematic diagram and a timing chart of a comparative example.

The semiconductor integrated circuit illustrated in FIG. 5 differs from the semiconductor integrated circuit illustrated in FIG. 1 in that it does not include the test control circuit 6, the clock control circuit 7, and the test output control circuit 8. The description of the configuration in common with FIG. 1 will be omitted, and differences from the circuit in FIG. 1 will be mainly described.

In the semiconductor integrated circuit having the above configuration, the clock (1) input from the clock input terminal 1 directly controls all FFs in the real circuit 5. Accordingly, the timing at which a data input (2) is input to the input FF 501 via the input buffer 3 and the timing at which the output control FF 503 operates to output the output control signal (n5.1) are the same. In response to the output of the output control signal (n5.1), the data output (n5.2) of the output FF 502 is output from the data input/output terminal 2 via the output buffer 4.

In this comparative example, the timing at which data is output, that is, the timing at which the output control signal (n5.1) permits the output of data from the output buffer 4, cannot be specified. Accordingly, as indicated at a time t501 in the timing chart in FIG. 5, the case may arise where input data (2) and output data (n4.1) output from the output buffer 4 collide with each other at the input buffer 3 and the value of the data input (n3.2) becomes indefinite. The data of the input FF 501 may therefore be corrupted.

Driving

Figure 6:
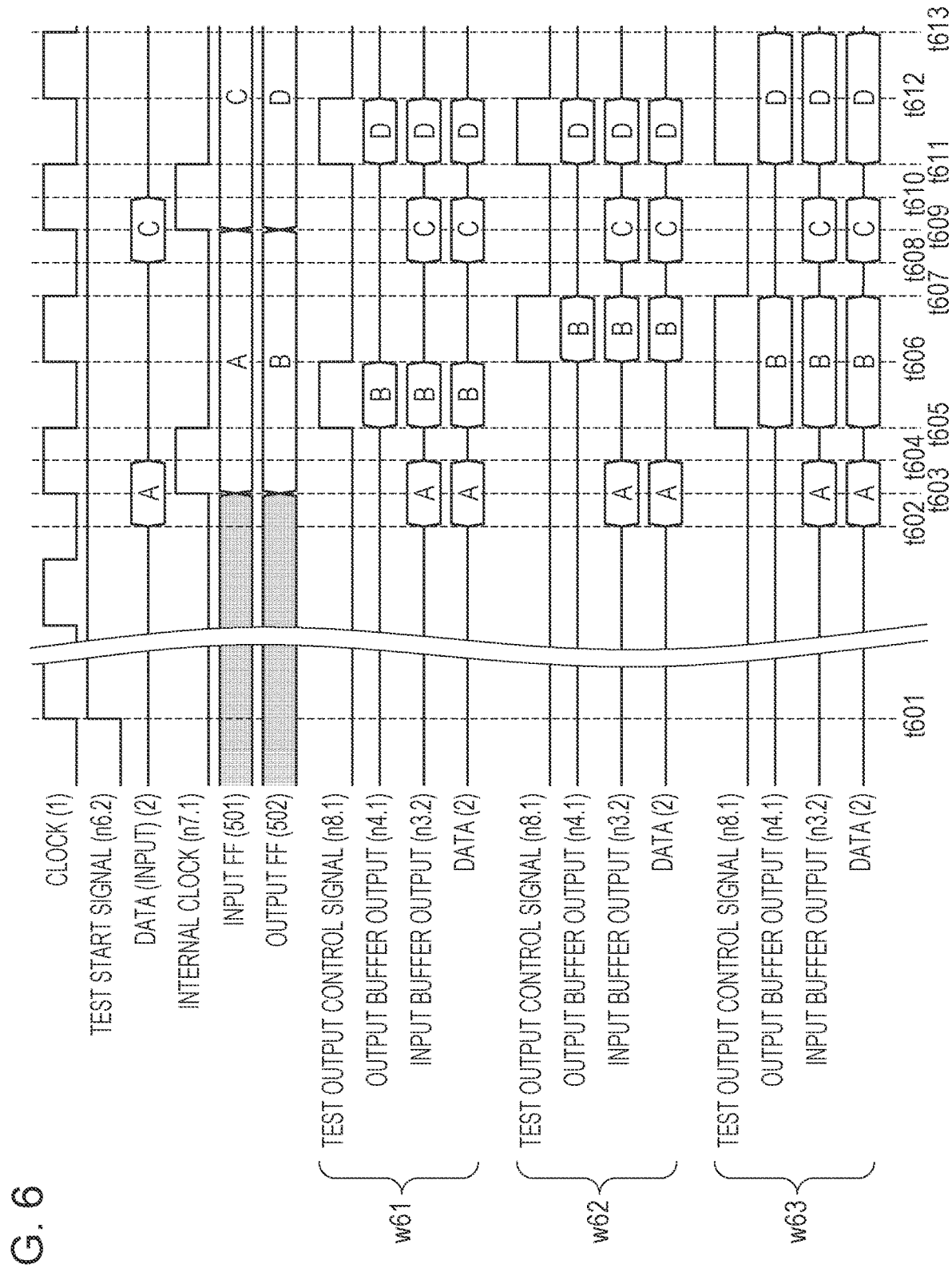
FIG. 6 is a timing chart in the first embodiment.
Figure 7:
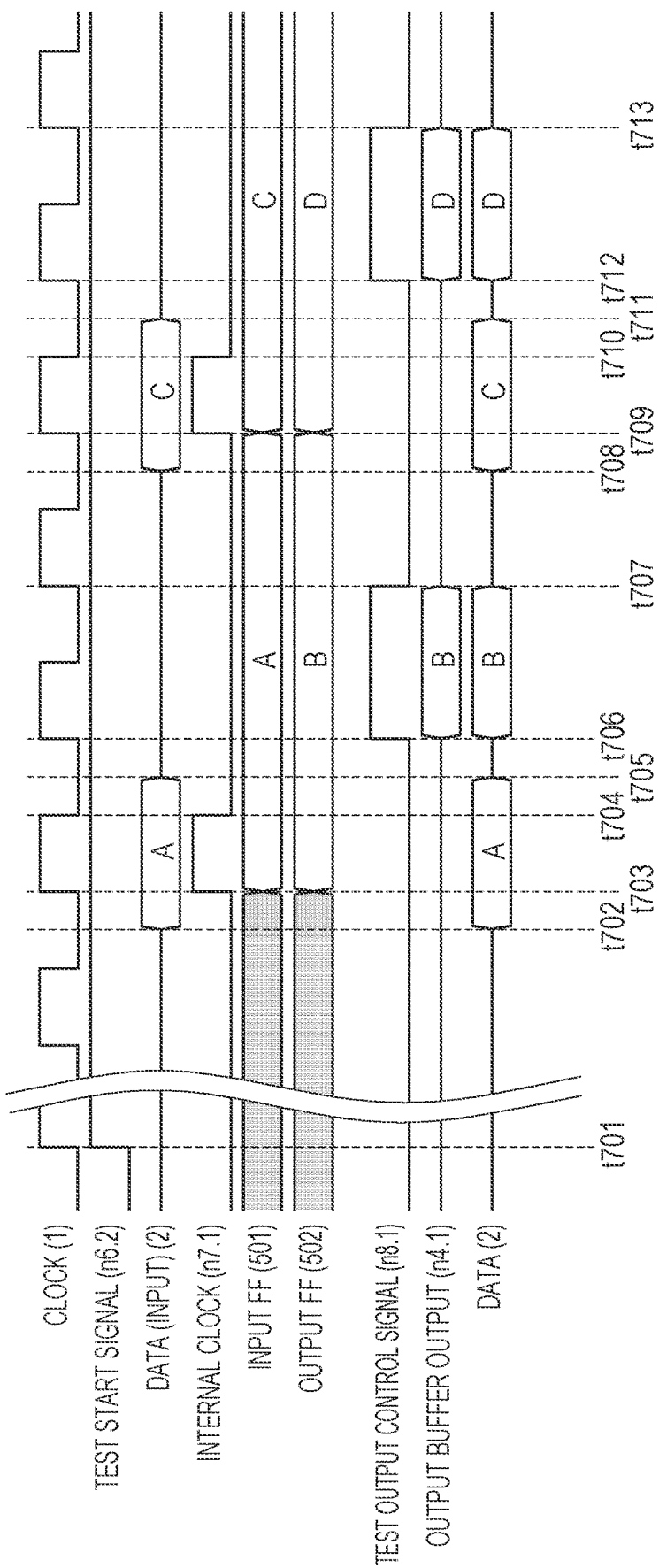
FIG. 7 is a timing chart in the first embodiment.

FIGS. 6 and 7 are exemplary timing charts when the collision between input data and output data, which occurs in the comparative example, can be prevented using a semiconductor integrated circuit having the circuit configuration illustrated in FIG. 1.

In FIG. 6, (w61) and (w62) are timing charts when the internal clock (n7.1) is output from the clock control circuit 7 every two clock cycles and the test output control signal (n8.1) of one-half clock cycle width is output from the test output control circuit 8. In FIG. 6, (w63) is a timing chart when the internal clock (n7.1) is output from the clock control circuit 7 every two clock cycles and the test output control signal (n8.1) of one clock cycle width is output from the test output control circuit 8.

In (w61) to (w63), the same operation is performed in a period from a time t601 to a time t604. The case where an operation in (w61) is performed will be mainly described below.

First, at the time t601, the test control circuit 6 generates the test start signal (n6.2). In response to the test start signal (n6.2), the data (2) is periodically input from the time t602. Here, the data (2) input at the time t602 is defined as data A, the data (2) input at a time t608 is defined as data C, an output corresponding to the data A is defined as data B, and an output corresponding to the data C is defined as data D.

At the time t603, the internal clock (n7.1) generated by the clock control circuit 7 is output and input to the input FF 501. As a result, the data A is taken in the input FF 501. At that time, since the test output control signal (n8.1) indicates Low, the output value of the output buffer 4 is not output.

In a period from the time t604 to a time t605 that is the falling edge of the clock (1), the input of the data (2) is stopped.

When the test output control signal (n8.1) is brought into High at the time t605, the output buffer 4 is permitted to perform an output operation by the output control signal (n5.1) and the data B is output from the output FF 502 via the output buffer 4.

When the test output control signal (n8.1) is brought into Low at a time t606 that is the rising edge of the next clock (1), the data B is not output from the output buffer 4.

The operation in the period from the time t602 to a time t607 enables the data (2) to be input to the input FF 501 and the output of the output FF 502 to be observed. In the period from a time t608 to a time t613, this operation is repeated.

The operation in (w61) has been described. In (w62), an operation similar to the operation in (w61) is performed in a period to the time t604 and then the data B is output at the time t606 and the output is stopped at the time t607 that is the falling edge of the test output control signal (n8.1). In (w63), the data B is output at the time t605 and the output is stopped at the time t607 that is the falling edge of the test output control signal (n8.1).

An input side is described first in this timing chart, but an output side may be described first.

FIG. 7 is a timing chart when the internal clock (n7.1) is output from the clock control circuit 7 every three clock cycles and the test output control signal (n8.1) is output from the test output control circuit 8 every three clock cycles. The data (2) input at a time t702 is defined as data A, the data (2) input at a time t708 is defined as data C, an output corresponding to the data A is defined as data B, and an output corresponding to that data C is defined as data D.

At a time t701, the test control circuit 6 generates the test start signal (n6.2). In response to the test start signal (n6.2), data is periodically input from the time t702.

In response to the internal clock (n7.1) generated by the clock control circuit 7 at a time t703, data is taken in the input FF 501. At that time, since the test output control signal (n8.1) indicates Low, the output value of the output buffer 4 is not output.

Before a time t706 that is the rising edge of the next test output control signal (n8.1), the input of the data A is stopped. When the data (2) is taken in the input FF 501 at the rising edge of the internal clock (n7.1), the data is input until a time t704 that is the falling edge of the clock (1). However, when the data (2) is taken in the input FF 501 at the falling edge of the internal clock (n7.1), the data (2) needs to be input until a time t705.

When the test output control signal (n8.1) is brought into High at the time t706 that is the next rising edge of the clock (1), the data B is output from the output FF 502 via the output buffer 4 (n4.1).

When the test output control signal (n8.1) is bought into Low at a time t707 that is the rising edge of the next clock (1), data is not output from the output buffer 4.

The operation in the period from the time t702 to the time t707 enables the data (2) to be input to the input FF 501 and the output of the output FF 502 to be observed. In the period from a time t708 to a time t713, this operation is repeated.

An input side is described first in this timing chart, but an output side may be described first like in the timing chart illustrated in FIG. 6.

The fault of a circuit is detected by comparing data output from the output buffer 4 with an expected value. The description of processing at a subsequent stage will be omitted. A comparator circuit for comparing output data with an expected value may be provided in this semiconductor integrated circuit or a tester disposed outside the semiconductor integrated circuit.

The operation of each circuit for the performance of the operations in the timing charts illustrated in FIGS. 6 and 7 will be described below.

Figure 8:
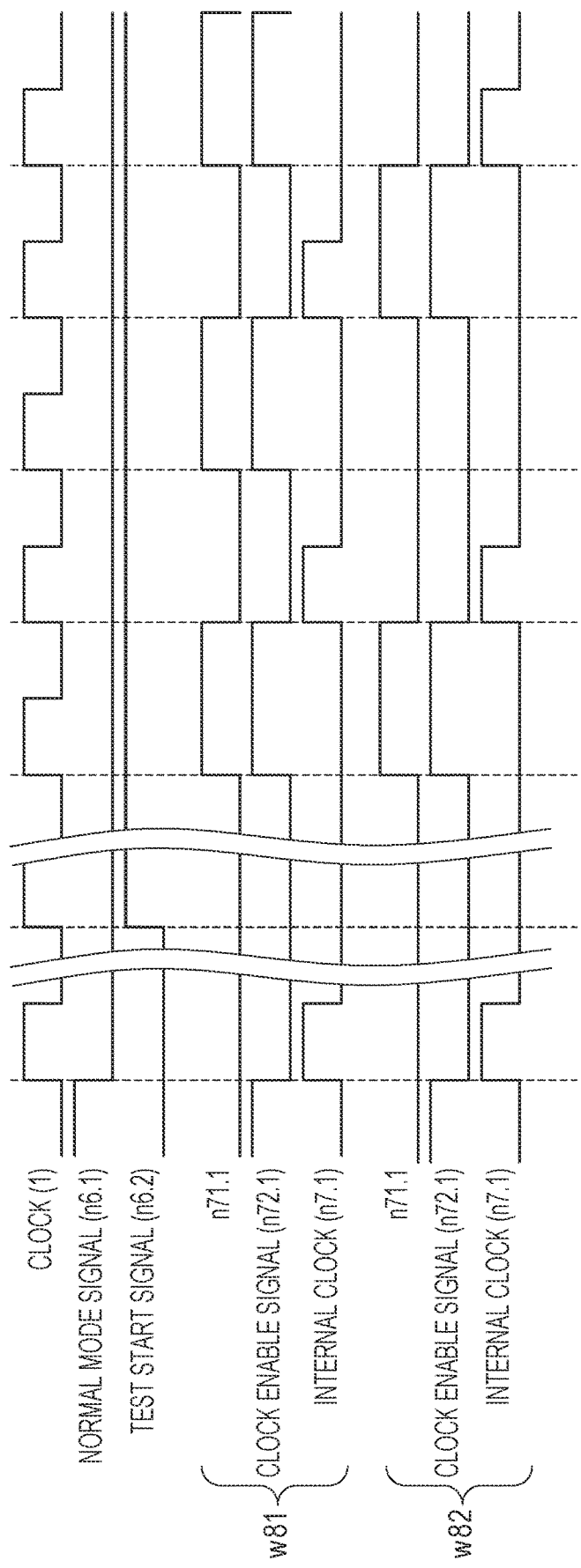
FIG. 8 is a timing chart of a clock control circuit according to the first embodiment.

FIG. 8 is an exemplary timing chart of the clock control circuit 7. As described above, the clock control circuit 7 generates the internal clock (n7.1) from the clock enable signal (n72.1) and the clock (1) which are input to the clock gating cell 73.

The clock enable signal (n72.1) is generated from the output (n71.1) of the comparator circuit 71 on the basis of the operation of the loop counter 65.

In the drawing, w81 is a timing chart when the internal clock (n7.1) is output every two clock cycles of the clock (1). In this case, by changing the clock enable signal (n72.1) in the order of High and Low every clock cycle, the internal clock (n7.1) can be output one time every two clock cycles.

In the drawing, w82 is a timing chart when the internal clock (n7.1) is output every three clock cycles of the clock (1). In this case, by changing the clock enable signal (n72.1) in the order of High, Low, and Low every clock cycle, the internal clock (n7.1) can be output one time every three clock cycles.

Figure 9:
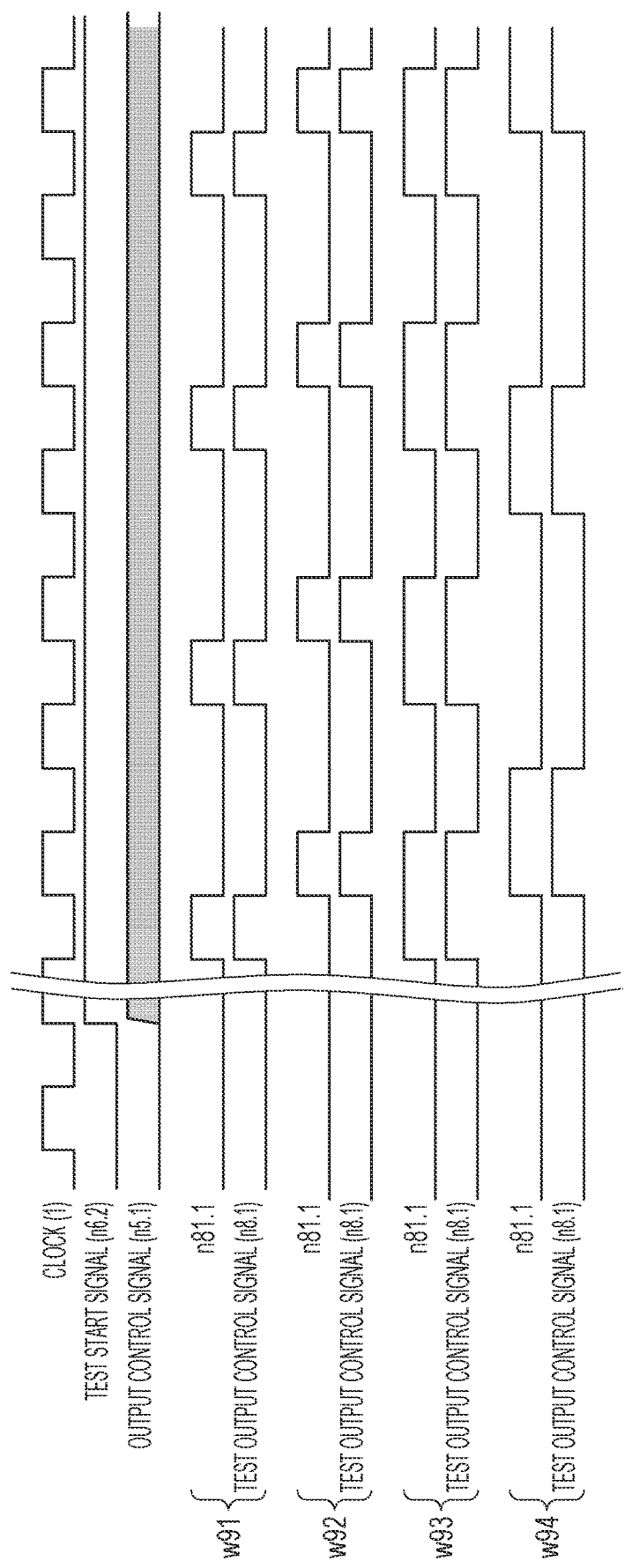
FIG. 9 is a timing chart of a test output control circuit according to the first embodiment.

FIG. 9 is an exemplary timing chart of the test output control circuit 8.

When the test start signal (n6.2) indicates High, the output (n81.1) of the comparator circuit 81 is output as the test output control signal (n8.1).

In the drawing, (w91) is a timing chart when the test output control signal (n8.1) of one-half clock cycle width is output every two clock cycles. The loop counter signal (n6.3) and the clock (1) are input to the comparator circuit 81. A comparison result (n81.1) indicates High at the falling edge of the clock (1) and Low at the rising edge of the clock (1). The output (n81.1) of the comparator circuit 81 is output via the multiplexer 82 as the test output control signal (n8.1).

The test output control signal (n8.1) does not necessarily have to have the form represented by w91.

In the drawing, (w92) is a timing chart when the test output control signal (n8.1) of one-half clock cycle width is output every two clock cycles. The test output control signal (n8.1) indicates High at the rising edge of the clock (1) and Low at the falling edge of the clock (1).

In the drawing, (W93) is a timing chart when the test output control signal (n8.1) of one clock cycle width is output every two clock cycles. The test output control signal (n8.1) indicates High or Low at the falling edge of the clock (1).

In the drawing, (W94) is a timing chart when the test output control signal (n8.1) of one clock cycle width is output every three clock cycles. The test output control signal (n8.1) indicates High or Low at the rising edge of the clock (1).

In any of the cases, the rising edge of the clock (1) and the rising edge of the test output control signal (n8.1) need to be shifted in time. Since the internal clock (n7.1) and the clock (1) are synchronized, the rising edge of the internal clock (n7.1) and the rising edge of the test output control signal (n8.1) are also output with a time lag. That is, the output of data every multiple clock cycles makes the clock (1) and the test output control signal (n8.1) have a phase difference.

By shifting input and output timings of data as above, the test of a semiconductor integrated circuit can be conducted without corruption of data even when the number of terminals available for the input and output of signals regarding a test is two including a bidirectional pin.

Second Embodiment

Figure 10:
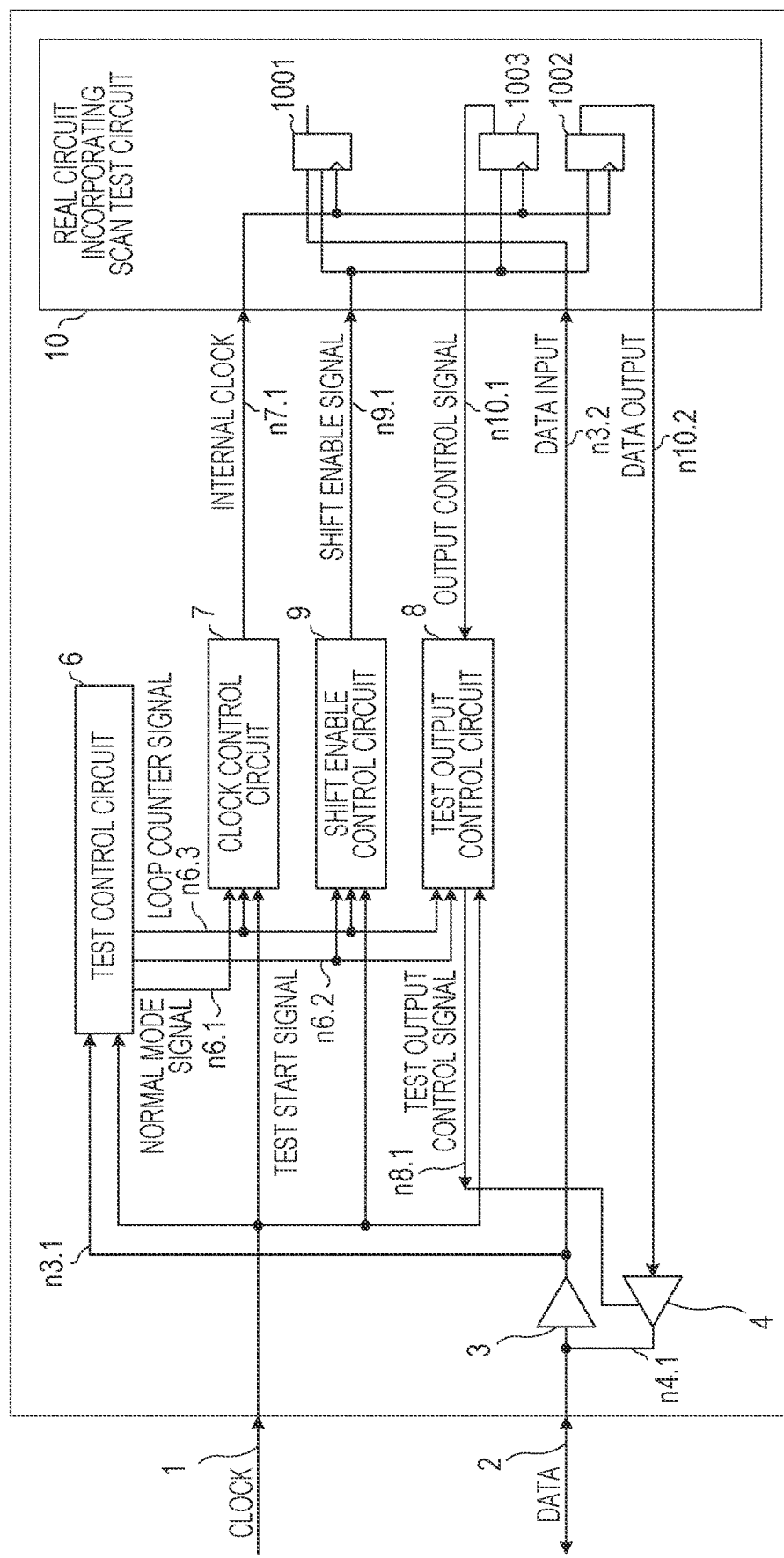
FIG. 10 is a schematic diagram of a semiconductor integrated circuit according to a second embodiment.

FIG. 10 is a schematic diagram of a semiconductor integrated circuit according to the second embodiment. The description of the point in common with the first embodiment will be omitted, and only different points from the circuit in FIG. 1 will be described.

The semiconductor integrated circuit illustrated in FIG. 10 includes a shift enable control circuit 9 and a real circuit 10 incorporating a test circuit capable of performing a scan test (hereinafter referred to as "real circuit 10"). The real circuit 10 further includes an input FF 1001, an output FF 1002, and an output control FF 1003.

A semiconductor integrated circuit according to the second embodiment can therefore conduct a stuck-at fault test.

The stuck-at fault test is a test for detecting a fault in which a certain node (the input terminal or output terminal of a logical gate or a flip-flop) is short-circuited to High or Low.

A scan test is conducted in such a manner that a test pattern is input to a test target circuit by a successive shift operation, the test target circuit is caused to perform a normal operation in one cycle, and then values are output from the test target circuit by a successive shift operation. A fault is detected by comparing the output value and an expected value with each other. For the conduction of a scan test, a real circuit includes a shift register including a plurality of flip-flops having respective externally controllable values.

The test control circuit 6 outputs the normal mode signal (n6.1), the test start signal (n6.2), and the loop counter signal (n6.3) on the basis of the clock (1) and the data (2) which have been input thereto. The normal mode signal (n6.1) is input to the clock control circuit 7 to drive the clock control circuit 7. The test start signal (n6.2) is input to the test output control circuit 8 and the shift enable control circuit 9. The loop counter signal (n6.3) is input to the clock control circuit 7, the test output control circuit 8, and the shift enable control circuit 9.

The clock control circuit 7 supplies the internal clock (n7.1) to be supplied to the real circuit 10.

The test output control circuit 8 receives the input of an output control signal (n10.1) from the real circuit 10 and outputs the test output control signal (n8.1). The output test output control signal (n8.1) is supplied to the output enable of the output buffer 4.

A signal (n3.2) is input to the input FF 1001 from the input buffer 3 in accordance with the internal clock (n7.1).

The output FF 1002 outputs a data output (n10.2) to the data (2) via the output buffer 4.

The output control signal (n10.1) output from the output control FF 1003 is input to the test output control circuit 8.

By shifting the timings of the internal clock (n7.1) output from the clock control circuit 7 and the test output control signal (n8.1) output from the test output control circuit 8, the collision between input data and output data can be prevented.

The use of the shift enable control circuit 9 enables the control of a scan input and the performance of a scan test.

Figure 11:
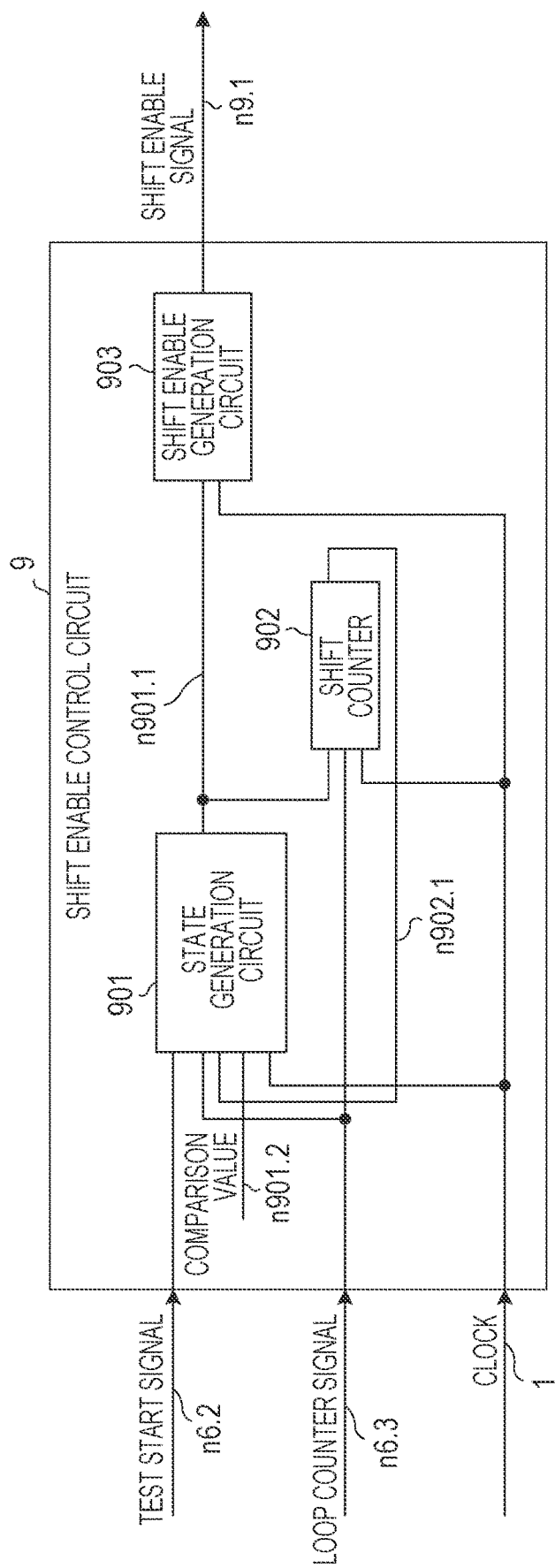
FIG. 11 is a schematic diagram of a shift enable control circuit according to the second embodiment.

FIG. 11 is a schematic diagram of the shift enable control circuit 9.

The shift enable control circuit 9 includes a state generation circuit 901, a shift counter 902, and a shift enable generation circuit 903.

The state generation circuit 901 receives the input of the test start signal (n6.2), the loop counter signal (n6.3), a comparison value (n901.2), and a shift counter value (n902.1) and outputs a state signal (n901.1).

The shift counter 902 is controlled by the state signal (n901.1) and the loop counter signal (n6.3) and outputs the shift counter value (n902.1).

The shift enable generation circuit 903 generates a shift enable signal (n9.1) using the state signal (n901.1) and the clock (1).

Figure 12:
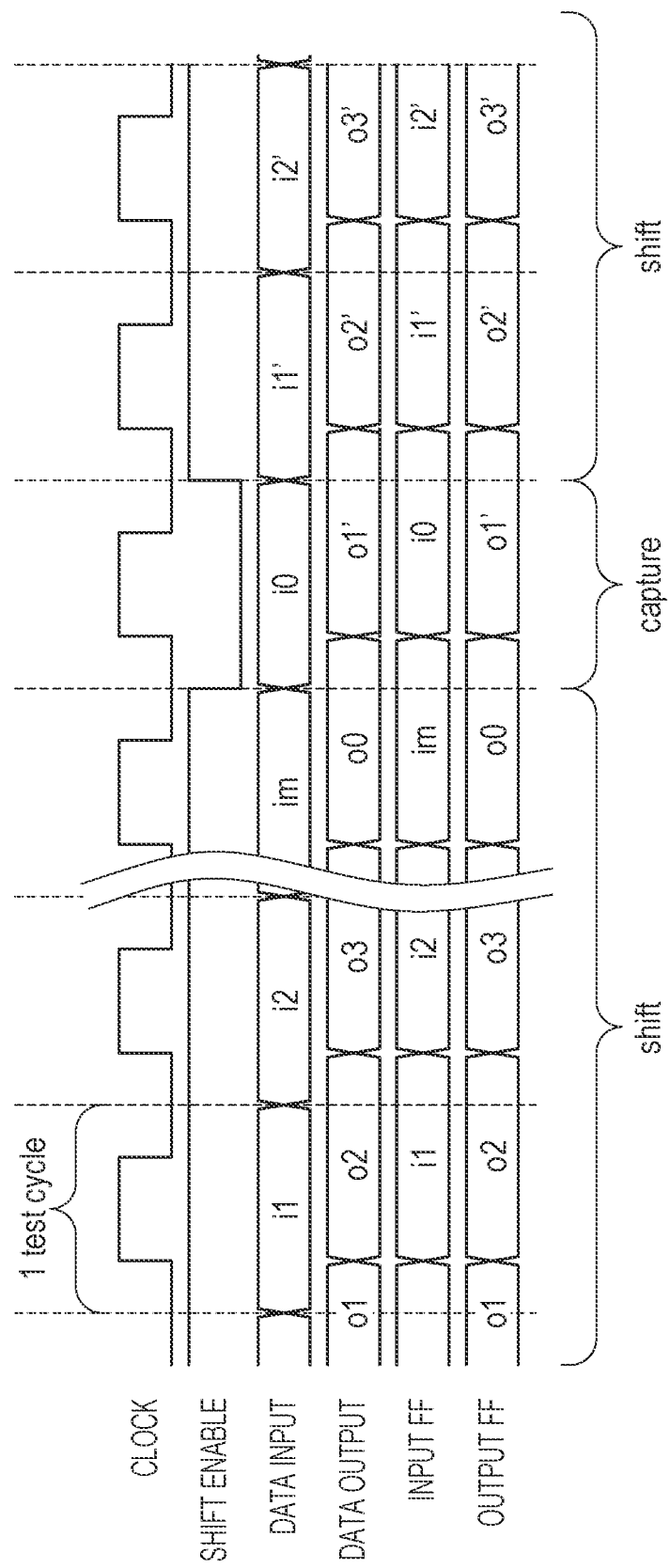
FIG. 12 is a timing chart of a scan test.

FIG. 12 is a timing chart of a typical stuck-at fault scan test.

A section between broken lines corresponds to one cycle of a tester. A scan test includes a shift period in which a test pattern is input by the shift operation of data and a capture period in which a circuit is actually operated to capture data.

In a scan test, four signal lines for the input of a clock signal, the input of a shift enable, the input of data, and the output of data are needed. Every clock cycle, data is output from a data output and data is input to a data input.

Figure 13:
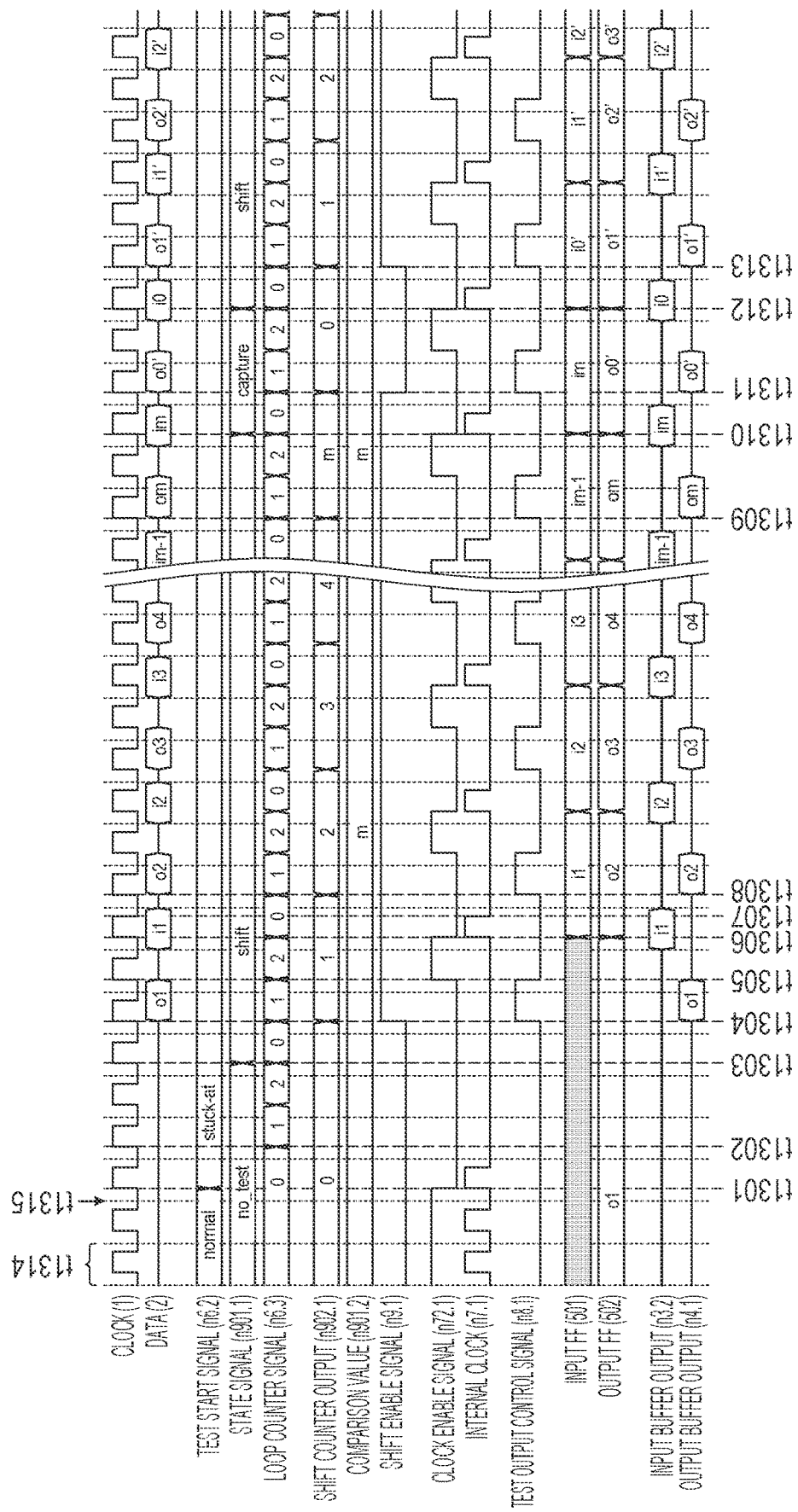
FIG. 13 is a timing chart in the second embodiment.

FIG. 13 is an exemplary timing chart of a stuck-at fault scan test according to this embodiment.

A section t1314 between broken lines in FIG. 13 corresponds to one test cycle.

First, at t1301, the test start signal (n6.2) makes a transition from normal to stuck-at by serial communication.

From the next clock cycle (t1302) after the transition of the test start signal (n6.2) to stuck-at, the loop counter signal (n6.3) starts to count. The loop counter signal (n6.3) repeatedly counts in the order of 0, 1, 2, 0, 1, 2 . . . .

When the value of the loop counter signal (n6.3) becomes two, the state signal (n901.1) makes a transition from no_test to shift at t1303 that is the rising edge of the next clock. The value of the loop counter signal becomes zero, and one is added to the value of the shift counter signal (n902.1) (t1304).

When the state signal (n901.1) indicates shift at t1304, the shift enable signal (n9.1) makes a transition from Low to High. When the value of the loop counter signal (n6.3) is zero, the test output control signal (n8.1) makes a transition from Low to High and data is output from the output buffer 4.

When the value of the loop counter signal (n6.3) is one, the test output control signal (n8.1) makes a transition from High to Low. The clock enable signal (n72.1) makes a transition from Low to High (t1305).

When the value of the loop counter signal (n6.3) is two, the clock enable signal (n72.1) makes a transition from High to Low (t1306).

From this point forward, the test output control signal (n8.1) indicates High when the value of the loop counter signal (n6.3) is zero and makes a transition to Low when the value of the loop counter signal (n6.3) is one. The clock enable signal (n72.1) indicates High when the value of the loop counter signal (n6.3) is one and makes a transition to Low when the value of the loop counter signal (n6.3) is two.

Since the clock enable signal (n72.1) indicates High at t1306, the internal clock (n7.1) indicates High.

Since the state signal (n901.1) indicates shift and the value of the loop counter signal (n6.3) is zero at t1308, one is added to the value of the shift counter and the output of the shift counter becomes two. The number of times of data shifting is defined as m, and the value of m is set as the comparison value (n901.2) in advance. This value is determined at the time of design.

Since the state signal (n901.1) indicates shift and the value of the loop counter signal (n6.3) is zero at t1309, one is added to the value of the shift counter and the output of the shift counter becomes m.

Since a shift counter output (n902.1) is m equal to the comparison value and the value of the loop counter signal (n6.3) is two at t1310, the state signal (n901.1) makes a transition from shift to capture.

Since the state signal (n901.1) indicates capture and the value of the loop counter signal (n6.3) is zero at t1311, the output of the shift counter is cleared to zero. At that time, the shift enable signal (n9.1) also makes a transition from High to Low.

Since the value of the shift counter signal (n902.1) is zero and the value of the loop counter signal (n6.3) is two at t1312, the state signal makes a transition from capture to shift.

When the value of the loop counter is zero at t1313 after the state signal (n901.1) has indicated shift like at t1304, one is also added to the value of the shift counter (902). The shift enable signal (n9.1) makes a transition from Low to High.

From this point forward, the operation in the period from t1305 to t1313 is repeated.

The data (2) starting with the lowercase letter "o" represents output data, and the data (2) starting with the lowercase letter "i" represents input data. Data output and data input do not collide because the data input can be determined in a tester cycle from a starting point t1315.

In this example, the test output control signal (n8.1) is allowed to output between the rising edge of the clock (1) in the (3d−1)th (d is an integer greater than or equal to two) from t1315 and the rising edge of the clock (1) in the 3dth clock cycle. Accordingly, by inputting data from a tester at a timing in the (3d+1)th clock cycle, the collision between signals can be prevented.

The clock enable signal (n72.1) makes a transition at the rising edge of the clock (1) in the 3dth (d is an integer greater than or equal to two) and the rising edge of the clock (1) in the (3d+1)th clock cycle. At a timing in the (3d+1)th clock cycle, the internal clock (n7.1) therefore makes a transition.

When d is set to be an integer greater than or equal to one, the test start signal (n6.2) and the state signal (n901.1) may simultaneously make respective transitions at the time of starting.

By shifting input and output timings of data as above, data input can be taken in the input FE Data input and data output can be performed without problems at the time of not only the shift operation but also the capture operation in a stuck-at fault scan test.

Third Embodiment

Figure 14:
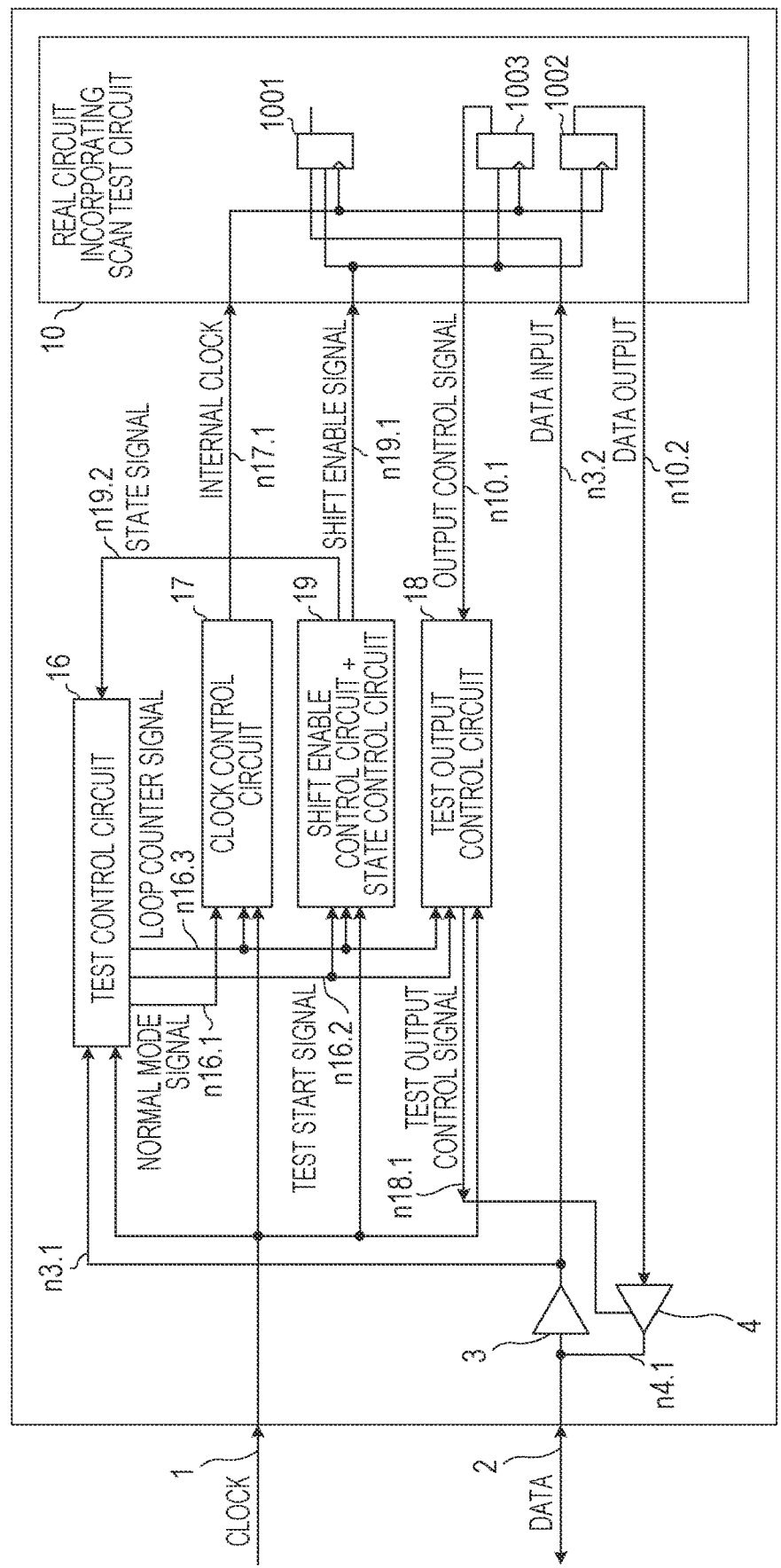
FIG. 14 is a schematic diagram of a semiconductor integrated circuit according to a third embodiment.

FIG. 14 is a schematic diagram of a semiconductor integrated circuit according to the third embodiment. The description of the point in common with the second embodiment will be omitted, and only different points from the circuit in FIG. 10 will be described.

The semiconductor integrated circuit illustrated in FIG. 14 has signals of the clock (1) and the data (2) and includes therein the input buffer 3, the output buffer 4, and the real circuit 10 incorporating a test circuit capable of performing a scan test (hereinafter referred to as "real circuit 10"). The semiconductor integrated circuit further includes a test control circuit 16, a clock control circuit 17, a test output control circuit 18, and a shift enable control circuit+state control circuit 19. The real circuit 10 includes the input FF 1001, the output FF 1002, and the output control FF 1003.

A semiconductor integrated circuit according to the third embodiment can switch between a stuck-at fault test and a transition fault test as a test to be conducted. A transition fault test is a kind of delay fault test for detecting a delay in signal propagation and is a test for detecting a delay of an input/output signal at a gate. A transition fault test is conducted in such a manner that a test pattern is input to a test target circuit by a shift operation, the circuit is caused to perform a normal operation in two cycles, and then obtained values are sequentially output by a shift operation. The fault of the circuit is detected by comparing the output value with an expected value.

The clock (1) drives the test control circuit 16, the clock control circuit 17, the test output control circuit 18, and the shift enable control circuit+state control circuit 19. The data (2) is input to the test control circuit 16 and the real circuit 10 via the input buffer 3 (n3.1 and n3.2).

The test control circuit 16 outputs a normal mode signal (n16.1), a test start signal (n16.2), and a loop counter signal (n16.3). The normal mode signal (n16.1) drives the clock control circuit 17.

The test start signal (n16.2) drives the test output control circuit 18 and the shift enable control circuit+state control circuit 19.

The loop counter signal (n16.3) drives the clock control circuit 17, the test output control circuit 18, and the shift enable control circuit+state control circuit 19.

The clock control circuit 17 outputs an internal clock (n17.1) to be supplied to the real circuit 10.

The shift enable control circuit+state control circuit 19 outputs a shift enable signal (n19.1) and a state signal (n19.2). The shift enable signal (n19.1) drives the real circuit 10. The state signal (n19.2) drives the test control circuit 16.

The test output control circuit 18 receives the input of the output control signal (n10.1) from the real circuit 10 and outputs a test output control signal (n19.1). The test output control signal (n19.1) is input to the output enable of the output buffer 4.

The signal (n3.2) is input to the input FF 1001 from the input buffer 3 at a timing corresponding to the internal clock (n7.1).

The data output (n10.2) output from the output FF 1002 is output from the data (2) via the output buffer 4.

The output control signal (n10.1) output from the output control FF 1003 is input to the test output control circuit 18.

By shifting the timings of the start-ups of the clock control circuit 17 and the test output control circuit 18, the collision between input data and output data can be prevented.

The use of the shift enable control circuit+state control circuit 19 enables a scan test.

Figure 15:
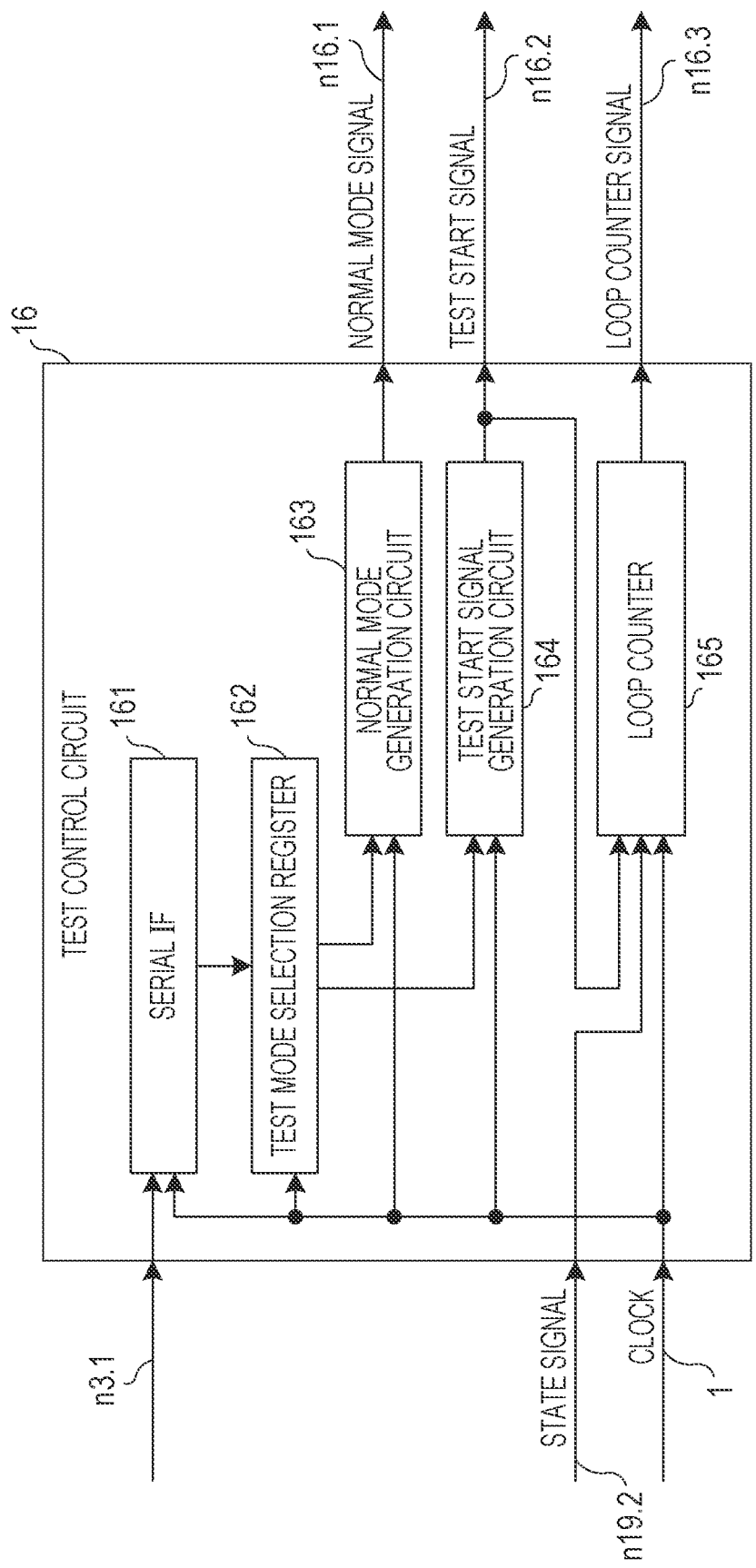
FIG. 15 is a schematic diagram of a test control circuit according to the third embodiment.

FIG. 15 is a schematic diagram of the test control circuit 16.

The test control circuit 16 includes a serial IF 161, a test mode selection register 162, a normal mode generation circuit 163, a test start signal generation circuit 164, and a loop counter 165.

The output (n3.1) of the input buffer 3 and the clock (1) are input to the serial IF 161.

The output signal of the serial IF 161 and the clock (1) are input to the test mode selection register 162. The output of the test mode selection register 162 and the clock (1) are input to the normal mode generation circuit 163 and the test start signal generation circuit 164.

The normal mode generation circuit 163 outputs the normal mode signal (n16.1) and has an initial value of High. The test start signal generation circuit 164 outputs the test start signal (n16.2) and has an initial state of normal.

The serial IF 161 writes the output value thereof into the test mode selection register 162 by communication and brings the normal mode signal (n16.1) into Low and makes the transition of the test start signal (n16.2) on the basis of the value. When a stuck-at fault test is conducted, the test start signal makes a transition to a stuck_at state. When a transition fault test is conducted, the test start signal makes a transition to a tft state.

The loop counter 165 is started by the test start signal (n16.2), and the upper count limit of the loop counter 165 is changed in accordance with a state signal. When the state signal indicates shift, capture, the loop counter repeatedly counts from zero to two. When the state signal indicates capture2, the loop counter counts from zero to three.

Figure 16:
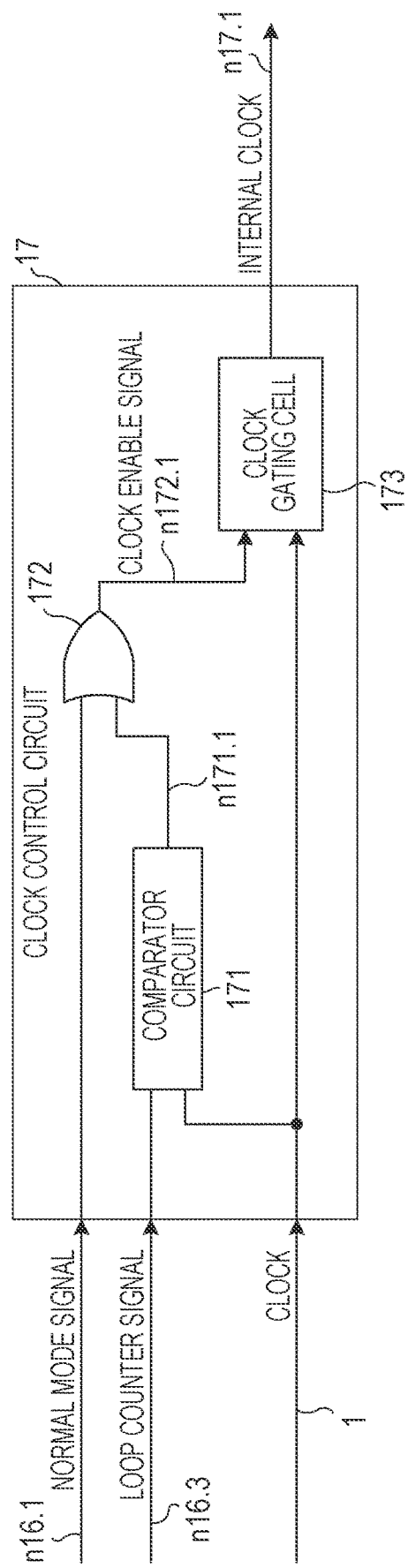
FIG. 16 is a schematic diagram of a clock control circuit according to the third embodiment.

FIG. 16 is a schematic diagram of the clock control circuit 17.

The clock control circuit 17 includes a comparator circuit 171, an OR circuit 172, and a clock gating cell 173.

The clock control circuit 17 receives the input of the normal mode signal (n16.1), the loop counter signal (n16.3), and the clock (1) and outputs the internal clock (n17.1).

The output (n171.1) of the comparator circuit 171 makes a transition when the value of the input loop counter signal (n16.3) is greater than or equal to a certain value. When the output signal of the comparator circuit 171 and the normal mode signal (n16.1) are input to the OR circuit 172, a clock enable signal (n172.1) is generated.

When the clock enable signal (n172.1) and the clock (1) are input to the clock gating cell 173, the internal clock (n17.1) is generated.

Figure 17:
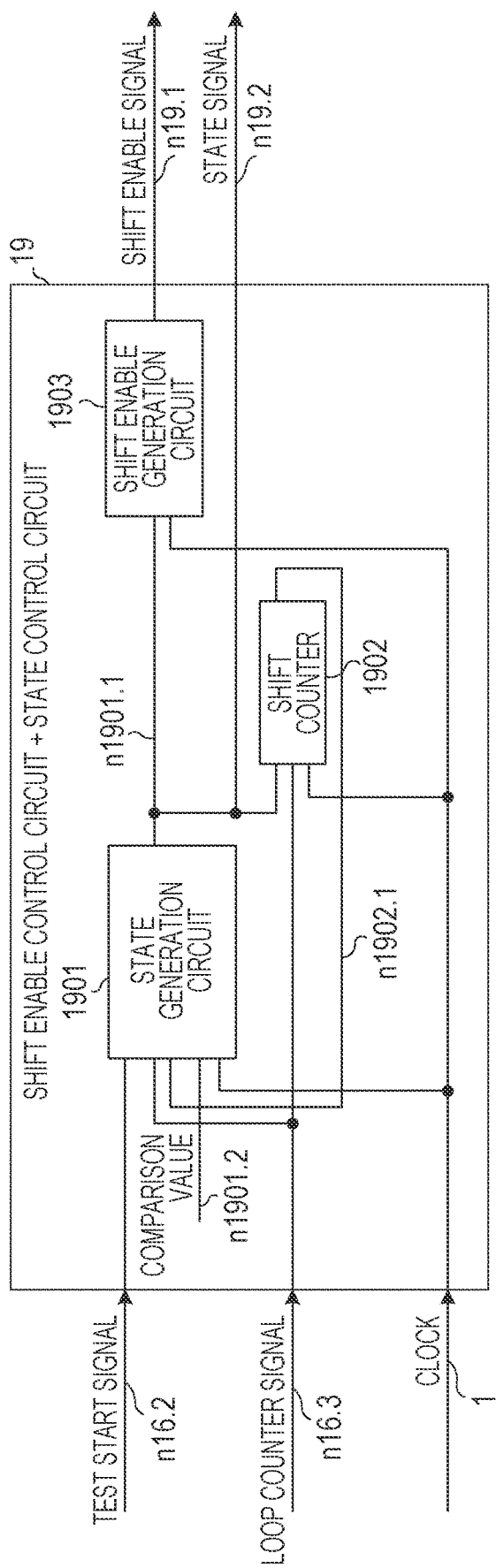
FIG. 17 is a schematic diagram of a shift enable control circuit according to the third embodiment.

FIG. 17 is a schematic diagram of the shift enable control circuit+state control circuit 19.

The shift enable control circuit+state control circuit 19 includes a state generation circuit 1901, a shift counter 1902, and a shift enable generation circuit 1903.

The state generation circuit 1901 generates the state signal (n19.2) using the test start signal (n16.2), the loop counter signal (n16.3), a shift counter signal (n1902.1), and a comparison value (n1901.2) and outputs the state signal (n19.2).

The shift counter 1902 is controlled by the state signal (n19.2) and the loop counter signal (n16.3) and generates and supplies the shift counter signal (n1902.1).

The shift enable generation circuit 1903 generates the shift enable signal (n19.1) using the state signal (n19.2) and the clock (1).

Figure 18:
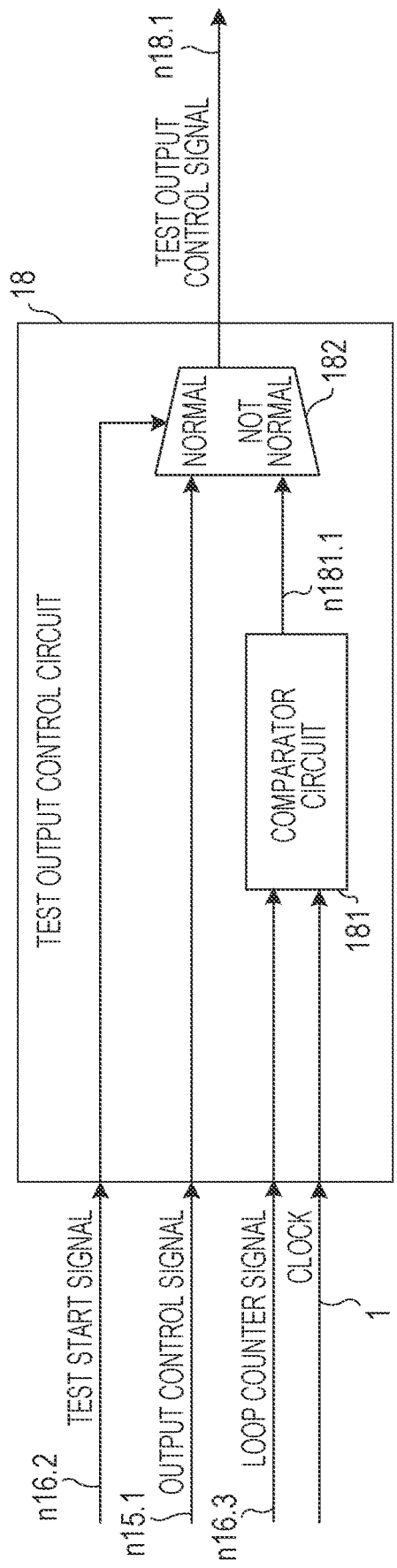
FIG. 18 is a schematic diagram of a test output control circuit according to the third embodiment.

FIG. 18 is a schematic diagram of the test output control circuit 18.

The test output control circuit 18 includes a comparator circuit 181 and a multiplexer 182.

The test output control circuit 18 receives the input of the test start signal (n16.2), an output control signal (n15.1), the loop counter signal (n16.3), and the clock (1) and outputs a test output control signal (n18.1).

An output (n181.1) of the comparator circuit 181 makes a transition when the value of the loop counter signal (n16.3) is a certain value. The multiplexer 182 is configured to select the comparator circuit output (n181.1) or the output control signal (n15.1) in response to the test start signal (n16.2).

When the state of the test start signal (n16.2) is normal, the output control signal (n15.1) output from the real circuit is selected. When the state of the test start signal (n16.2) is not normal, the signal (n181.1) output from the comparator circuit 181 is output.

Figure 19:
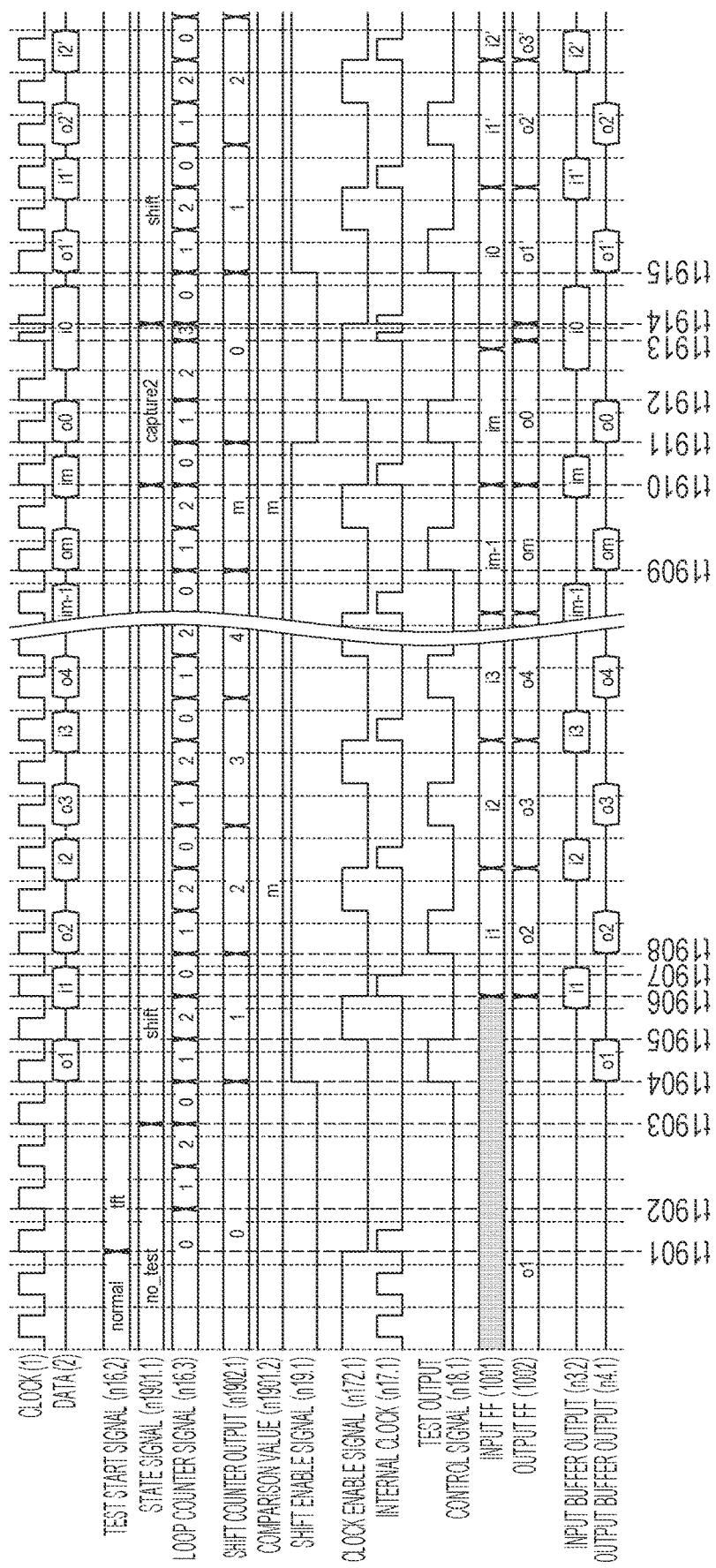
FIG. 19 is a timing chart in the third embodiment.

FIG. 19 is an exemplary timing chart of a transition fault scan test.

At a time t1901, the test start signal (n16.2) makes a transition from normal to tft by serial communication.

From the next clock cycle (t1902) after the transition of the test start signal (n16.2) to tft, the loop counter signal (n16.3) starts to count. The loop counter signal (n16.3) repeatedly counts in the order of 0, 1, 2, 0, 1, 2 . . . .

When the value of the loop counter signal (n16.3) becomes 2, the state signal (n1901.1) makes a transition from no_test to shift at t1903. The value of the loop counter signal becomes zero, and one is added to the value of the shift counter signal (n1902.1).

When the state signal (n1901.1) indicates shift at t1904, the shift enable signal (n19.1) makes a transition from Low to High. The test output control signal (n18.1) makes a transition from Low to High when the value of the loop counter signal (n16.3) is zero. From this point forward, the test output control signal (n18.1) indicates High when the loop count is zero.

When the state signal (n1901.1) indicates shift and the value of the loop counter signal (n16.3) is one (t1905), the test output control signal (n18.1) makes a transition from High to Low and the clock enable signal (n172.1) makes a transition from Low to High.

When the state signal (n901.1) indicates shift and the value of the loop counter signal (n16.3) is two (t1906), the clock enable signal (n172.1) makes a transition from High to Low.

From this point forward, a test output control signal (n18.1) indicates High when the value of the loop counter signal (n16.3) is zero and makes a transition to Low when the value of the loop counter signal (n16.3) is one. The clock enable signal (n172.1) indicates High when the value of the loop counter signal (n16.3) is one and makes a transition to Low when the value of the loop counter signal (n16.3) is two.

Since the clock enable signal (n172.1) indicates High at t1906, the internal clock (n17.1) also indicates High.

Since the state signal (n1901.1) indicates shift and the value of the loop counter signal (n16.3) is zero at t1908, one is added to the value of the shift counter and the shift counter output becomes two. The number of times of data shifting is defined as m, and the value of m is set as the comparison value (n1901.2) in advance. This value is determined at the time of design.

Since the state signal (n1901.1) indicates shift and the value of the loop counter signal (n16.3) is zero at t1909, one is added to the value of the shift counter and the shift counter output becomes m.

Since the test start signal (n16.2) indicates tft, a shift counter output (n11902.1) is m equal to the comparison value, and the value of the loop counter signal (n16.3) is two at t1910, the state signal (n1901.1) makes a transition from shift to capture2.

Since the state signal (n1901.1) indicates capture2 and the value of the loop counter signal (n16.3) is zero at t1911, the shift counter output is cleared to zero. At that time, the shift enable signal (n19.1) also makes a transition from High to Low.

Since the state signal (n1901.1) indicates capture2 and the value of the loop counter signal (n16.3) is one at t1912, the clock enable signal (n172.1) makes a transition from Low to High. The test output control signal (n18.1) makes a transition from High to Low.

Since the state signal (n1901.1) indicates capture2 at t1913, the value of the loop counter signal (n16.3) makes a transition from two to three. The indication of the clock enable signal (n172.1) remains High.

Since the state signal (n1901.1) indicates capture2 at t1914, the value of the loop counter signal (n16.3) makes a transition from three to zero. The state signal (n1901.1) makes a transition from capture2 to shift.

When the loop counter signal (n16.3) is zero at t1915 after the state signal (n1901.1) has made a transition to shift like at t1904, one is added to the value of the shift counter signal (n1902.1). When the state signal (n1901.1) indicates shift, the shift enable signal (n19.1) makes a transition from Low to High.

From this point forward, the operation in the period from t1905 to t1915 is repeated.

By shifting input and output timings of data as above, a transition fault scan test can be conducted without corruption of data even when the number of terminals available for the input and output of signals regarding a test is two including a bidirectional pin.

Fourth Embodiment

Figure 20A:
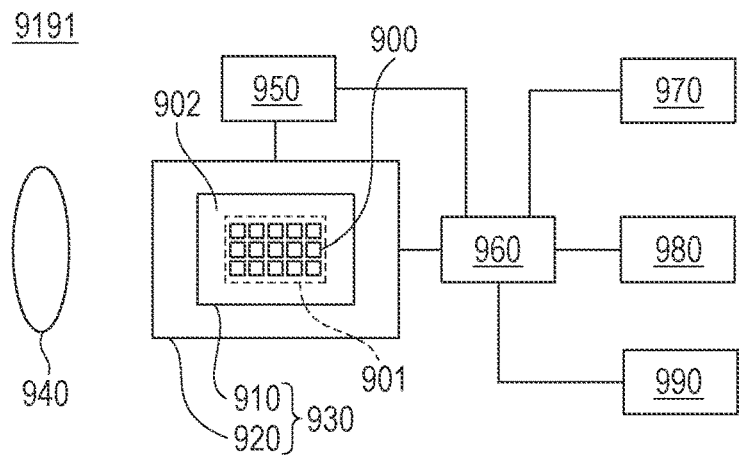
FIGS. 20A, 20B, 20C are diagrams illustrating the configuration of equipment.
Figure 20B:
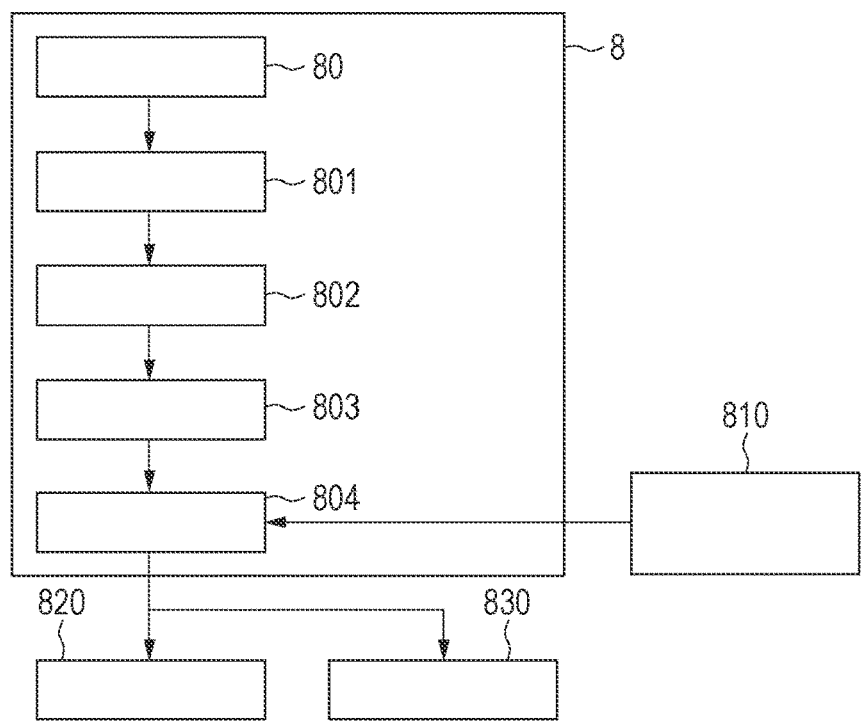
Figure 20C:
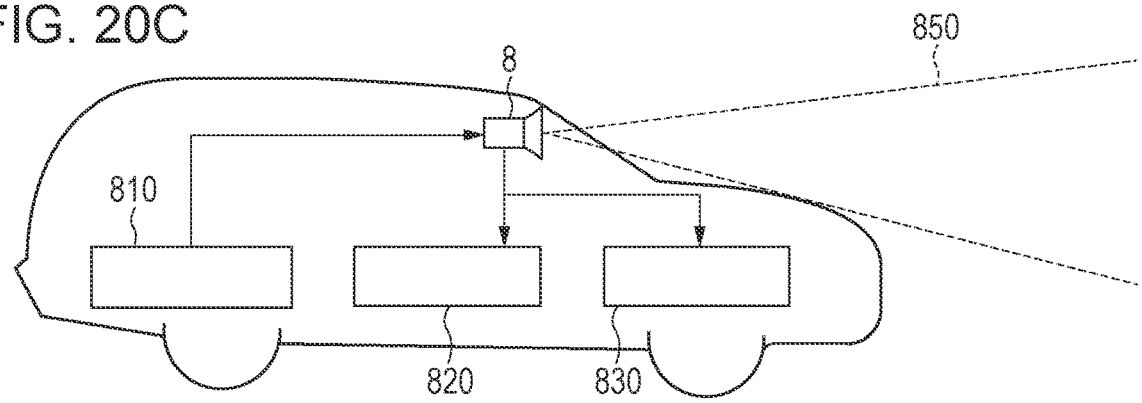

The fourth embodiment is applicable to all of the first to third embodiments. FIG. 20A is a schematic diagram describing equipment 9191 including a semiconductor apparatus 930 according to this embodiment. As the semiconductor apparatus 930, for example, a photoelectric conversion apparatus including pixels that convert incident light to electric charges can be used.

The equipment 9191 including the semiconductor apparatus 930 will be described in detail below. The semiconductor apparatus 930 can include, in addition to a semiconductor device 910, a package 920 for housing a semiconductor device 910. The package 920 can include a substrate to which the semiconductor device 910 is fixed, a lid body made of, for example, glass facing the semiconductor device 910, and a joining member such as a bonding wire or a bump that connects a terminal provided on the substrate and a terminal provided on the semiconductor device 910 to each other.

The equipment 9191 can include at least any of an optical apparatus 940, a control apparatus 950, a processing apparatus 960, a display apparatus 970, a storage apparatus 980, and a machine apparatus 990. The optical apparatus 940 corresponds to the semiconductor apparatus 930 and is, for example, a lens, a shutter, and a mirror. The control apparatus 950 controls the semiconductor apparatus 930 and is, for example, a semiconductor apparatus such as an application-specific integrated circuit (ASIC).

The processing apparatus 960 processes signals output from the semiconductor apparatus 930 and is a semiconductor apparatus such as a CPU or an ASIC for constructing an analog front end (AFE) or a digital front end (DFE). The display apparatus 970 is an EL display apparatus or a liquid crystal display apparatus that displays information (an image) obtained by the semiconductor apparatus 930. The storage apparatus 980 is a magnetic device or a semiconductor device that stores information (an image) obtained by the semiconductor apparatus 930 and is a volatile memory such as an SRAM or a DRAM or a nonvolatile memory such as a flash memory or a hard disk drive.

The machine apparatus 990 has a movable portion or a propelling portion such as a motor or an engine. The equipment 9191 displays a signal output from the semiconductor apparatus 930 on the display apparatus 970 or transmits the signal to the outside using a communication apparatus (not illustrated) included in the equipment 9191. Therefore, the equipment 9191 preferably further includes the storage apparatus 980 and the processing apparatus 960 separately from a storage circuit and a computation circuit that are included in the semiconductor apparatus 930. The machine apparatus 990 may be controlled based on a signal output from the semiconductor apparatus 930.

The equipment 9191 is suitable for electronic equipment such as an information terminal (for example, a smartphone or a wearable terminal) having an image capturing function or a camera (for example, an interchangeable lens camera, a compact camera, a video camera, or a surveillance camera). The machine apparatus 990 in a camera can drive components of the optical apparatus 940 for the purposes of zooming, focusing, and shutter operations. Alternatively, the machine apparatus 990 in a camera can move the semiconductor apparatus 930 for the purpose of an antivibration operation.

The equipment 9191 may be transportation equipment such as a vehicle, a vessel, or an aircraft. The machine apparatus 990 in transportation equipment may be used as a moving apparatus. The equipment 9191 as transportation equipment is suitable as equipment that transports the semiconductor apparatus 930 or equipment that assists and/or automates driving (operation) using an image capturing function. The processing apparatus 960 for assisting and/or automating driving (operation) can perform processing for operating the machine apparatus 990 that is a moving apparatus based on information obtained by the semiconductor apparatus 930. Alternatively, the equipment 9191 may be medical equipment such as an endoscope, measuring equipment such as a ranging sensor, analyzing equipment such as an electron microscope, office equipment such as a copier, or industrial equipment such as a robot.

According to the above embodiments, excellent pixel characteristics can be obtained. Accordingly, the value of the semiconductor apparatus can be increased. The increase in value herein corresponds to at least any of the addition of functions, the improvement in performance, the improvement in characteristics, the increase in reliability, the increase in yield rate, the reduction in environmental load, the reduction in cost, the reduction in size, and the reduction in weight.

Thus, by using the semiconductor apparatus 930 according to this embodiment for the equipment 9191, the value of the equipment can also be increased. For example, the semiconductor apparatus 930 can be mounted on transportation equipment, and high performance can be obtained when the transportation equipment captures an outside image or measures outside environment. Thus, a decision to mount a semiconductor apparatus according to this embodiment on transportation equipment has benefits in increasing the performance of the transportation equipment for the manufacture and sale of the transportation equipment. In particular, the semiconductor apparatus 930 is suitably used in assisting transportation equipment and/or for transportation equipment performing automatic driving using information obtained by the semiconductor apparatus.

Modifications

The present disclosure is not limited to the above embodiments and can include various modifications.

For example, an example in which a part of the configuration of any of the embodiments is added to another embodiment or an example in which a part of the configuration of any of the embodiments is replaced with a part of the configuration of another embodiment is also one of the embodiments of the present disclosure.

The circuits in the respective embodiments of the present disclosure may be disposed on a single semiconductor substrate. Alternatively, a stacked structure may be used in which the circuits are disposed on two or more semiconductor substrates and the substrates are bonded together. For example, a stacked structure in which three or more substrates are stacked may be formed by classifying the circuits or adding a circuit or a function.

The above embodiments only show concrete examples in embodying the present disclosure, and the technical range of the present disclosure should not be considered in a restrictive manner by these embodiments. That is, the present disclosure may be embodied in various forms without departing from the technical idea or essential characteristics thereof.

According to an embodiment of the present disclosure, the interference between input data and output data can be less likely to occur without the increase in the number of input terminals or the increase in circuit area when a semiconductor integrated circuit is tested using a bidirectional pin.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-059051 filed Mar. 31, 2021, which is hereby incorporated by reference herein in its entirety.

What is claimed is:

1. A semiconductor integrated circuit configured to input and output signals regarding a test using two terminals, the semiconductor integrated circuit comprising:
a bidirectional terminal for input and output of data and an input terminal for input of a clock signal; and
an output control circuit,
wherein a signal is output via the bidirectional terminal in accordance with an output control signal output from the output control circuit, and
wherein the output control circuit is configured to perform control in synchronization with the clock signal to prevent data input to the bidirectional terminal and an output permission signal based on the output control signal from overlapping each other.

2. The semiconductor integrated circuit according to claim 1, further comprising a real circuit including a shift register including a plurality of flip-flops, wherein a scan test is conducted in such a manner that values held in the plurality of flip-flops are controlled outside the real circuit.

3. The semiconductor integrated circuit according to claim 2, further comprising a control circuit configured to generate a signal for controlling input of data to the real circuit.

4. The semiconductor integrated circuit according to claim 3, wherein the control circuit configured to generate the signal for controlling input of data to the real circuit further generates a signal for controlling scan input of data to the real circuit in accordance with the clock signal.

5. The semiconductor integrated circuit according to claim 3, wherein the control circuit configured to generate the signal for controlling the input of data to the real circuit is controlled based on a count value of a counter which is periodically changed.

6. The semiconductor integrated circuit according to claim 2, wherein the scan test includes a period in which data is input to the real circuit and a period in which the real circuit is actually operated.

7. A photoelectric conversion apparatus comprising:
a pixel configured to convert incident light to an electric charge; and
the semiconductor integrated circuit according to claim 1, wherein the semiconductor integrated circuit processes an output signal of the pixel.

8. An apparatus comprising the semiconductor integrated circuit according to claim 1, further comprising at least any of:
an optical device corresponding to the semiconductor integrated circuit;
a control device configured to control the semiconductor integrated circuit;
a processing device configured to process a signal output from the semiconductor integrated circuit;
a display device configured to display information obtained by the semiconductor integrated circuit;
a storage device configured to store information obtained by the semiconductor integrated circuit; and
a machine device configured to operate based on information obtained by the semiconductor integrated circuit.

9. A semiconductor integrated circuit configured to input and output signals regarding a test using two terminals, comprising:
a bidirectional terminal for input and output of data and an input terminal for input of a clock signal;

an input buffer and an output buffer, wherein the bidirectional terminal being connected to the input buffer and the output buffer;

an output control circuit configured to output an output control signal for controlling the output buffer; and a clock control circuit configured to gate the clock signal to generate an internal clock for controlling the output control circuit.

10. The semiconductor integrated circuit according to claim 9, further comprising a real circuit including a shift register including a plurality of flip-flops, wherein a scan test is conducted in such a manner that values held in the plurality of flip-flops are controlled outside the real circuit.

11. The semiconductor integrated circuit according to claim 10, further comprising a control circuit configured to generate a signal for controlling input of data to the real circuit.

12. The semiconductor integrated circuit according to claim 11, wherein the control circuit configured to generate the signal for controlling the input of data to the real circuit further generates a signal for controlling scan input of data to the real circuit in accordance with the clock signal.

13. A semiconductor substrate stacked on another semiconductor substrate, comprising:

two terminals, including a bidirectional terminal for input and output of data and an input terminal for input of a clock signal used as terminals via which signals regarding a test are input and output; and an output control circuit, wherein a signal is output via the bidirectional terminal in accordance with an output control signal output from the output control circuit, and wherein the output control circuit is configured to perform control in synchronization with the clock signal to prevent data input to the bidirectional terminal and an output permission signal based on the output control signal from overlapping each other.

14. The semiconductor substrate according to claim 13, wherein the other semiconductor substrate includes a pixel that converts incident light to an electric charge.

15. A test method of testing a semiconductor integrated circuit, comprising:

inputting and outputting signals regarding a test using two terminals, including a bidirectional terminal for input and output of data and an input terminal for input of a clock signal; and changing the bidirectional terminal from an input terminal to an output terminal in a period between input of the data and next input of the data.

16. The test method according to claim 15, further comprising performing an output of the signal every multiple clock cycles of the clock signal.

17. The test method according to claim 15, further comprising conducting a first test in a first mode by a first operation and a second test in a second mode by a second operation different from the first operation.

18. The test method according to claim 17, wherein the first mode is a mode in which a test for detecting a stuck-at fault is conducted, and wherein the second mode is a mode in which a test for detecting a transition fault is conducted.

* * * * *